United States Patent
Lin et al.

(10) Patent No.: US 8,227,827 B2
(45) Date of Patent: Jul. 24, 2012

(54) LIGHT EMITTING DEVICE

(75) Inventors: Ming-Te Lin, Yingge Township, Taipei County (TW); Ming-Yao Lin, Banciao (TW); Kuang-Yu Tai, Hsinchu (TW)

(73) Assignee: Industrial Technology Research Institute, Hsinchu (TW)

(*) Notice: Subject to any disclaimer, the term of this patent is extended or adjusted under 35 U.S.C. 154(b) by 0 days.

(21) Appl. No.: 12/949,192

(22) Filed: Nov. 18, 2010

(65) Prior Publication Data

US 2011/0057225 A1     Mar. 10, 2011

Related U.S. Application Data

(62) Division of application No. 12/408,979, filed on Mar. 23, 2009, now Pat. No. 7,872,273.

(30) Foreign Application Priority Data

Mar. 28, 2008  (TW) ............................... 97111495 A

(51) Int. Cl.
   *H01L 33/00* (2010.01)
(52) U.S. Cl. ............ 257/98; 257/99; 257/100; 257/666; 257/E33.058; 257/E33.059; 257/E33.061
(58) Field of Classification Search .................... 257/98, 257/99, 100, 666, E33.058, E33.059, E33.061
   See application file for complete search history.

(56) References Cited

U.S. PATENT DOCUMENTS

| | | | |
|---|---|---|---|
| 6,799,870 B2 | 10/2004 | Lin | |
| 7,166,873 B2 | 1/2007 | Okazaki | |
| 2004/0217692 A1 | 11/2004 | Cho et al. | |
| 2006/0273337 A1 | 12/2006 | Han et al. | |
| 2007/0165417 A1 | 7/2007 | Wu et al. | |
| 2007/0187705 A1 | 8/2007 | Tanaka et al. | |

FOREIGN PATENT DOCUMENTS

| | | |
|---|---|---|
| CN | 100370629 | 11/2004 |
| CN | 2718787 | 8/2005 |
| CN | 1665038 | 9/2005 |
| CN | 1870309 | 11/2006 |
| CN | 2859211 | 1/2007 |
| CN | 1992455 | 7/2007 |
| EP | 0 342 961 | 11/1989 |
| JP | 2006-339639 | 12/2006 |
| TW | 556971 | 10/2003 |
| TW | 558173 | 10/2003 |
| TW | M253906 | 12/2004 |

(Continued)

OTHER PUBLICATIONS

Taiwanese language Notice of Allowance dated Feb. 14, 2012.

(Continued)

*Primary Examiner* — Long Pham
(74) *Attorney, Agent, or Firm* — Thomas|Kayden

(57) ABSTRACT

A light emitting device includes a leadframe, a light emitting unit, a transparent encapsulant, and a fluorescent colloid layer. The light emitting unit is disposed on the leadframe. The transparent encapsulant covers the light emitting unit, wherein the transparent encapsulant has a concave on which at least one reflective surface is disposed. The fluorescent colloid layer is disposed outside the transparent encapsulant, wherein a chamber is formed between the fluorescent colloid layer and the transparent encapsulant. The light generated by the light emitting unit is reflected by the reflective surface and guided to a side wall of the fluorescent colloid layer.

18 Claims, 44 Drawing Sheets

FOREIGN PATENT DOCUMENTS

| | | |
|---|---|---|
| TW | M267637 | 6/2005 |
| TW | M314299 | 6/2007 |
| TW | M324849 | 1/2008 |

OTHER PUBLICATIONS

Taiwanese language Notice of Allowance dated Feb. 21, 2012.
English language translation of abstract of EP 0 342 961 (published Nov. 23, 1989).
English language translation of abstract of TW 556971 (published Oct. 1, 2003).
English language translation of abstract of TW 558173 (published Oct. 11, 2003).
English language translation of abstract of TW M253906 (published Dec. 21, 2004).
English language translation of abstract of TW M267637 (published Jun. 11, 2005).
English language translation of abstract of JP 2006-339639 (published Dec. 14, 2006).
English language translation of abstract of CN 2859211 (published Jan. 17, 2007).
English language translation of abstract of TW M314299 (published Jun. 21, 2007).
English language translation of abstract of TW M324849 (published Jan. 1, 2008).

LIGHT EMITTING DEVICE

This application is a divisional application of co-pending U.S. application Ser. No. 12/408,979, filed Mar. 23, 2009, which claims the benefit of Taiwan applications Ser. No. 97111495, filed Mar. 28, 2008, the subject matters of which are incorporated herein by reference.

BACKGROUND OF THE DISCLOSURE

1. Field of the Disclosure

The disclosure relates in general to a light emitting device, and more particularly to a light emitting device with uniform light emitting effect.

2. Description of the Related Art

Examples of the use of light emitting device in the areas of households, business, offices, vehicles or factory include incandescent lamp, fluorescent lamp, halogen lamp, or a combination thereof.

In recent years, light emitting diode (LED) has been regarded as the best choice of light emitting device due to the features of low driving voltage, fast turning on, no mercury pollution, no ultra-velvet (UV) light, solid-state package. Furthermore, LED being small in volume can meet the requirements of many light-weighted, small, thin and compact products.

In most light emitting devices, LED is used as a point light source. How to make the distribution of the light sources uniformed when LED is used as a light source in a particular product has become an important issue to be considered.

Whatever types of light emitting devices during operation will generate high temperature and affect the electronic elements in the surrounds. Hence, how to effectively enhance heat dissipation of the light emitting device is also an imminent issue to be resolved.

Nowadays, manufacturers are all very sensitive to cost and benefits. How to reduce the manufacturing cost of the light emitting device but at the same time maintaining the reliability of the light emitting device has become another issue to be resolved.

SUMMARY OF THE DISCLOSURE

The disclosure is directed to a light emitting device applicable to many electronic devices and uses, providing uniform light emitting effect.

According to a first aspect of the present disclosure, a light emitting device is provided. The light emitting device includes a leadframe, a light emitting unit, a transparent encapsulant, and a fluorescent colloid layer. The light emitting unit is disposed on the leadframe. The transparent encapsulant covers the light emitting unit, wherein the transparent encapsulant has a concave on which at least one reflective surface is disposed. The fluorescent colloid layer is disposed outside the transparent encapsulant, wherein a chamber is formed between the fluorescent colloid layer and the transparent encapsulant. The light generated by the light emitting unit is reflected by the reflective surface and guided to a side wall of the fluorescent colloid layer.

According to a second aspect of the present disclosure, a light emitting device is provided. The light emitting device includes a leadframe, a light emitting unit, a non-transparent side element, a transparent encapsulant, and a fluorescent colloid layer. The light emitting unit is disposed on the leadframe. The non-transparent side element surrounds the light emitting unit. The transparent encapsulant covers the light emitting unit and is located inside the non-transparent side element, wherein an upper surface of the transparent encapsulant has a concave on which a reflective surface is disposed. The fluorescent colloid layer is disposed at the side wall of the transparent encapsulant and located between the non-transparent side element and the transparent encapsulant. The light generated by the light emitting unit is reflected by the reflective surface and guided to the side wall of the transparent encapsulant to excite the fluorescent colloid layer and generate a mixed light, the mixed light is then guided to the top of the transparent encapsulant by the non-transparent side element.

According to a third aspect of the present disclosure, a light emitting device is provided. The light emitting device includes a leadframe, a non-transparent carrier, a light emitting unit, a transparent encapsulant, and a plurality of fluorescent colloid layers. The non-transparent carrier is disposed under the leadframe. The light emitting unit is disposed on the leadframe. The transparent encapsulant covers the light emitting unit and is disposed on the non-transparent carrier, wherein an upper surface of the transparent encapsulant has a plurality of reflective surfaces. The fluorescent colloid layers are disposed at a plurality of side walls of the transparent encapsulant and adjacent to the reflective surfaces. When the light of the light emitting unit is guided to the fluorescent colloid layers by the reflective surfaces of the transparent encapsulant, the light then excites the fluorescent colloid layers.

According to a fourth aspect of the present disclosure, a light emitting device is provided. The light emitting device includes a leadframe, a light emitting unit, a transparent encapsulant, a fluorescent colloid layer, a non-transparent reflective layer, and a non-transparent carrier. The light emitting unit is disposed on the leadframe. The transparent encapsulant covers the light emitting unit and has a reflective surface. The fluorescent colloid layer is disposed on the reflective surface of the transparent encapsulant. The non-transparent reflective layer covers the fluorescent colloid layer. The non-transparent carrier is disposed at the bottom side of the leadframe. The light generated by the light emitting unit is guided to the fluorescent colloid layer by the non-transparent reflective layer for exciting the fluorescent colloid layer, and the light from the fluorescent colloid layer and the light emitting unit is controlled to be outputted from a region restricted by the non-transparent carrier and the non-transparent reflective layer.

The disclosure will become apparent from the following detailed description of the preferred but non-limiting embodiments. The following description is made with reference to the accompanying drawings.

DETAILED DESCRIPTION OF THE DISCLOSURE

Figure 1A:
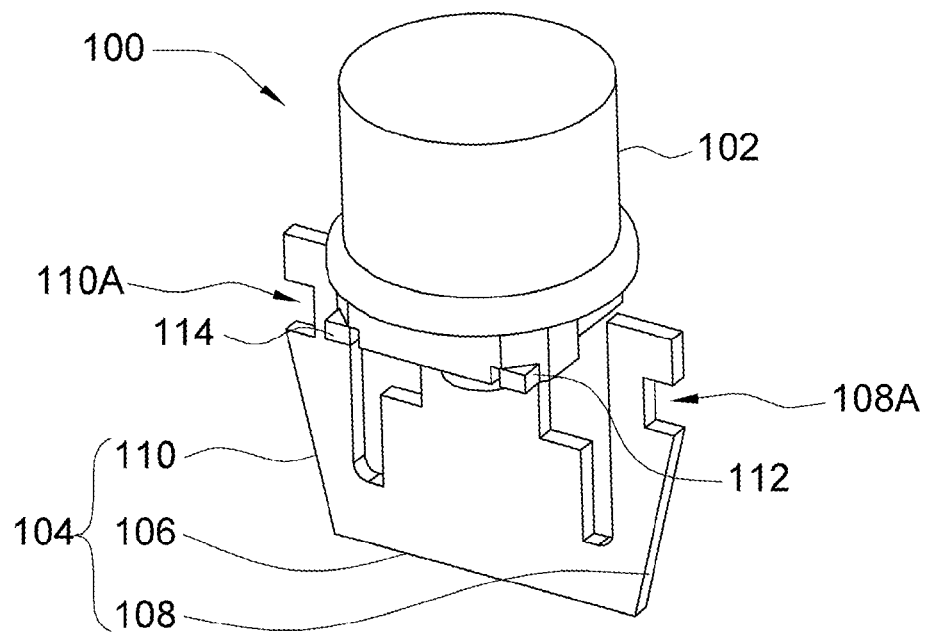
FIGS. 1A and 1B show a light emitting device with positioning function for assembly according to a preferred embodiment of the disclosure viewed from different view angles.
Figure 1B:
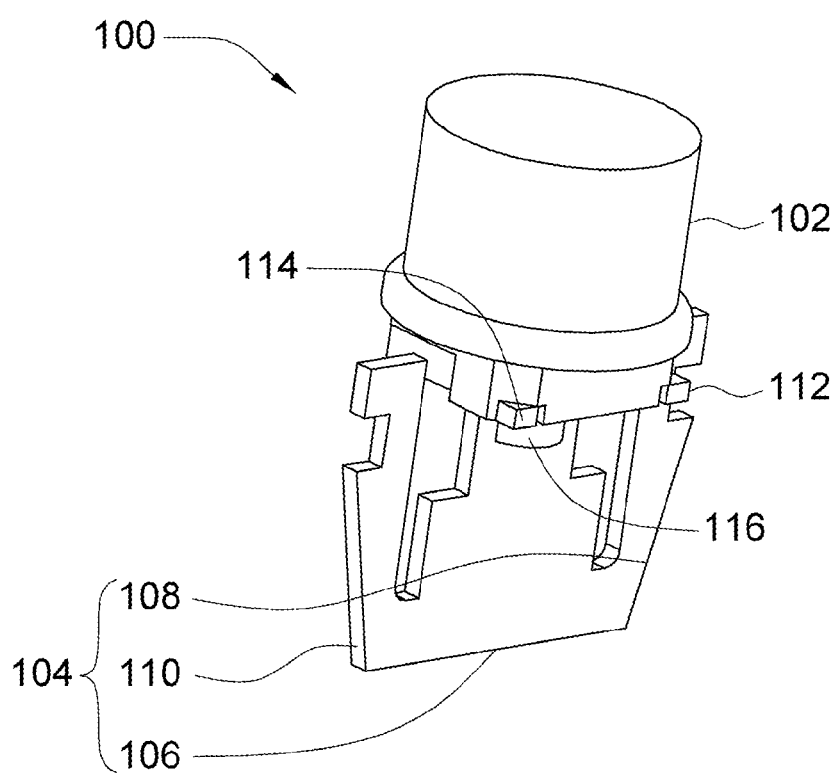

Referring to FIGS. 1A and 1B, diagrams of a light emitting device with positioning function for assembly according to a preferred embodiment of the disclosure viewed from different view angles is shown. The light emitting device 100 includes a light emitting unit 102 and a leadframe 104. The leadframe 104 includes a board body 106 and at least one positioning arm. In the present embodiment of the disclosure, the leadframe 104 has two positioning arms 108 and 110. One end of the board body 106 is connected to the light emitting unit 102, and the other end is connected to the two positioning arms 108 and 110 extended toward the light emitting unit 102. Preferably, the two positioning arms 108 and 110 are symmetric to the board body 106.

As the positioning arms 108 and 110 are extended upward from the bottom of the board body 106, the positioning arms 108 and 110 are like elastic hooks making the leadframe 104 easy to be assembled to other elements. In addition, the positioning arms 108 and 110 and the board body 106 have a junction in the shape of an arc that enhances the elastic feature between the positioning arms 108 and 110 and the board body 106, such that the structure of the positioning arms 108 and 110 will not be damaged during the assembly of the leadframe 104.

To make the leadframe 104 more firmly and steadily fixed on other elements, two positioning recesses 108A and 110A are disposed on the positioning arms 108 and 110, respectively. The positioning recesses 108A and 110A are respectively positioned at the end of the positioning arms 108 and 110 adjacent to the light emitting unit 102 for wedging with other elements.

Figure 1C:
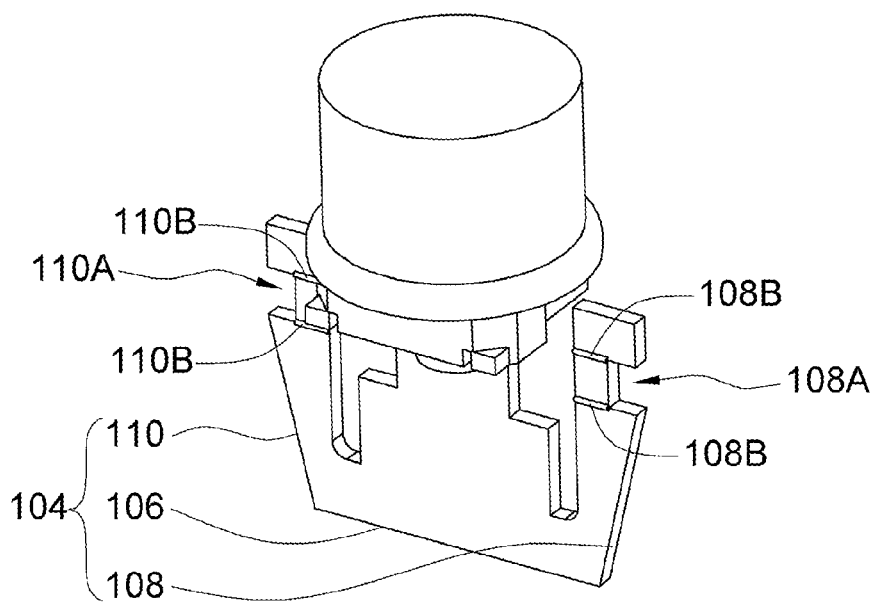
FIG. 1C shows a positioning arm of FIG. 1A having several protruding structures.

In addition to using the positioning recesses 108A and 110A to prevent the leadframe 104 from moving upward/downward, various elements can also be disposed on the positioning arms 108 and 110 to prevent the leadframe 104 from moving in other directions. Referring to FIG. 1C, a positioning arm of FIG. 1A having several protruding structures is shown. Several protruding structures 108B and 1108 can be disposed at two sides of the positioning recesses 108A and 110A of the positioning arms 108 and 110 respectively for increasing the thickness of a part of the positioning arms 108 and 110. Let the positioning recess 108A and its adjacent protruding structures 108B be taken for example. When the positioning arm 108 passes through the opening (such as the opening 150A of FIG. 2A) of an element and the positioning recess 108A wedges with the element, the two protruding structures 108B enable the positioning arm 108 to contact the inside wall of the opening tightly, hence preventing the positioning arm 108 from wobbling due to the clearance of the opening.

Figure 1D:
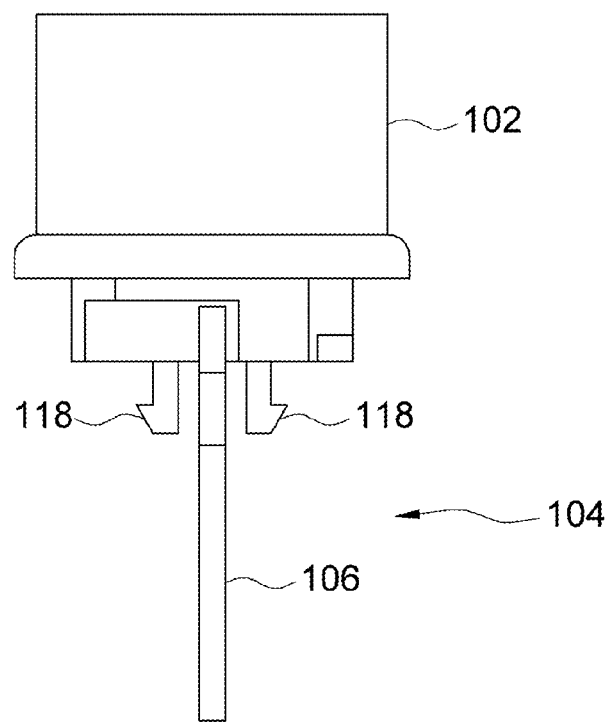
FIG. 1D shows a leadframe having a pair of hooks.
Figure 1E:
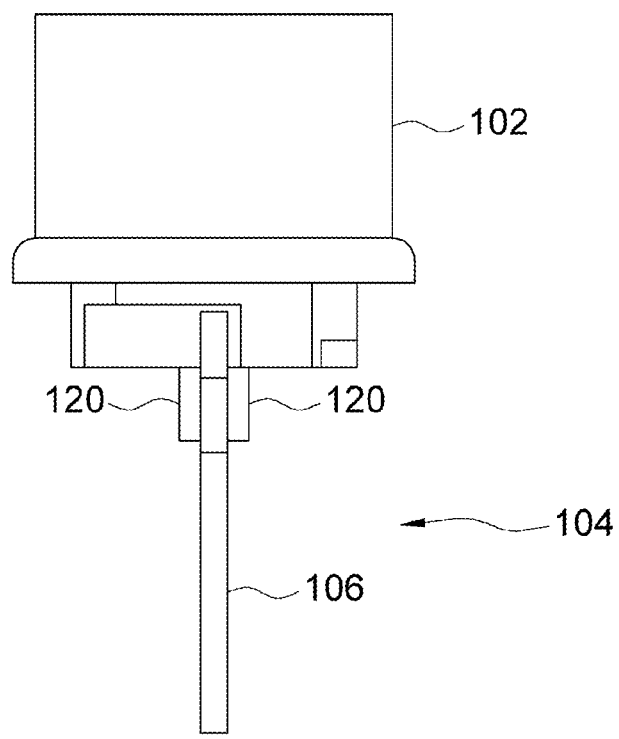
FIG. 1E shows a leadframe having detachable pieces.

The light emitting unit 102 of the present embodiment of the disclosure, for example, includes an LED chip (not illustrated) and has two electrode pins 112 and 114 on the bottom surface for electrically connecting the light emitting unit 102 to other elements as shown in FIGS. 1A and 1B. The leadframe 104 further has a guide piece 116 disposed on the board surface of the board body 106 and adjacent to the light emitting unit 102. The guide piece 116 and the board body 106 can be integrally formed in one piece to facilitate fixing of the leadframe 104. The guide piece 116 can have other forms of structure. FIG. 1D shows a leadframe having a pair of hooks. FIG. 1E shows a leadframe having detachable pieces. As shown in FIG. 1D, the guide piece 116 can be replaced by a pair of hooks 118. The pair of hooks 118 being adjacent to the light emitting unit 102 and positioned at two opposite sides of the board body 106 can also be used to facilitate fixing of the leadframe 104. As shown in FIG. 1E, the two opposite sides of the guide pieces 116 can be replaced by two detachable pieces 120 with weaker structure. The detachable pieces 120 are positioned at two sides of the board body 106 under the light emitting unit 102. During the assembly of the leadframe 104, the detachable pieces 120 are either damaged or stay on the leadframe 104 and used as an element to facilitate fixing of the leadframe 104.

Figure 1F:
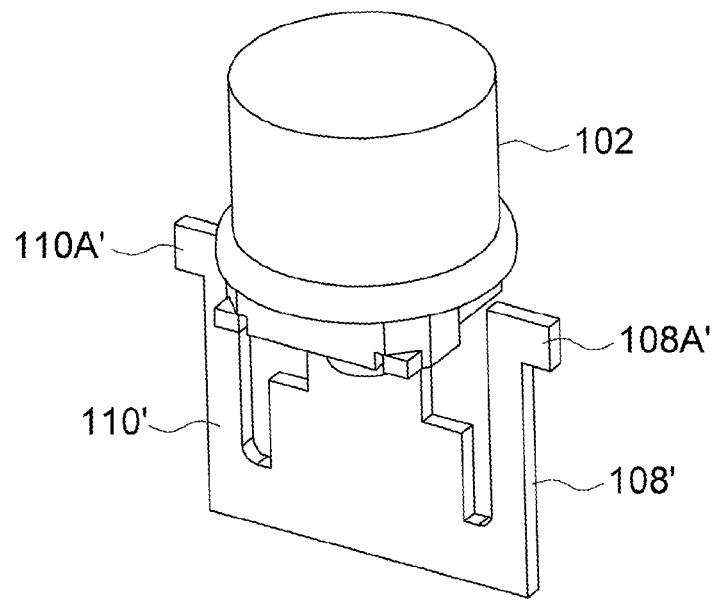
FIG. 1F shows a positioning arm having several bending ends.

Despite the positioning arms 108 and 110 wedge with other elements through the positioning recesses 108A and 110A in the present embodiment of the disclosure, the positioning arms 108 and 110 are not limited thereto and can have other structural designs. Referring to FIG. 1F, a positioning arm having several bending ends is shown. The positioning arms 108' and 110' are respectively bent outwards from the part near the light emitting unit 102 and form the bending ends 108A' and 110A', such that the positioning arms 108' and 110' possess one-way stopping function when assembled to other elements.

Figure 1G:
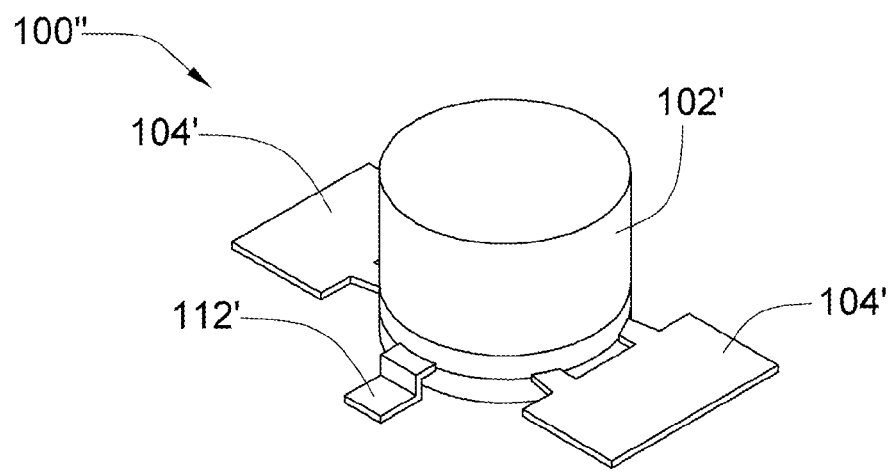
FIG. 1G shows a light emitting device having two leadframes.
Figure 1H:
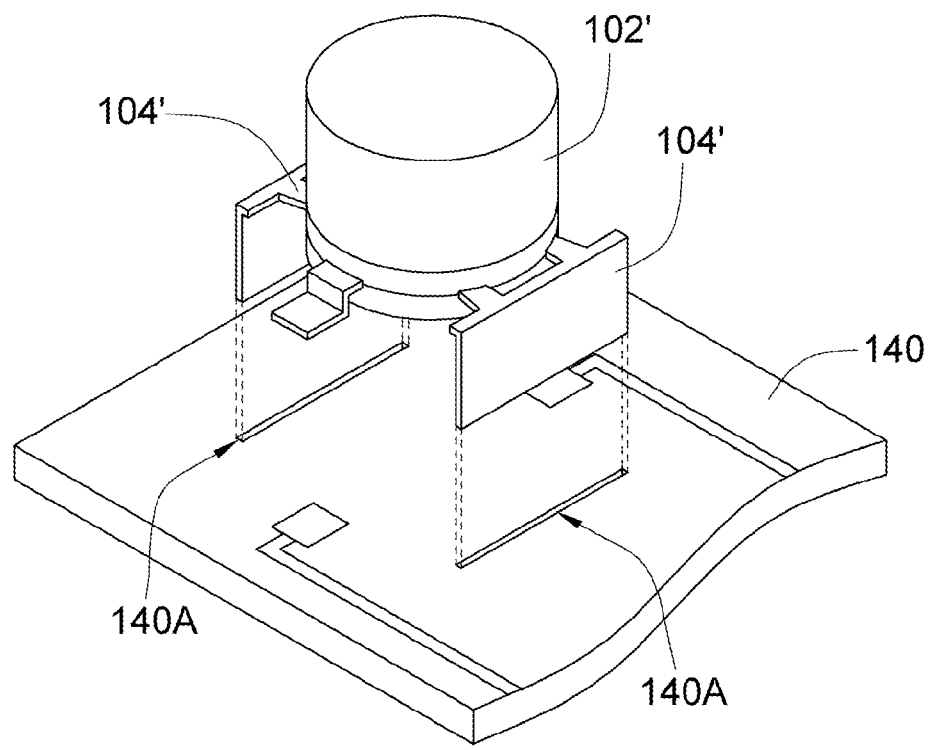
FIG. 1H shows a light emitting device of FIG. 1G and a corresponding circuit board.

FIG. 1G shows a light emitting device having two leadframes. FIG. 1H shows a light emitting device of FIG. 1G and a corresponding circuit board. The two leadframes 104' of the light emitting device 100' are respectively disposed at two symmetric sides of the light emitting unit 102'. The leadframe 104' can have the same or different structure with the leadframe 104. In the present example, the leadframe 104' is a rectangular structure formed from a single board. As shown in FIG. 1H, when the light emitting device 100' is assembled to a circuit board 140, the two leadframes 104' of the light emitting device 100' start to be bent downward and inserted into the two openings 140A of the circuit board 140. Moreover, the electrode pins 112' of the light emitting device 100' are electrically connected to the circuit board 140 after the light emitting device 100' is assembled to the circuit board 140.

Figure 1I:
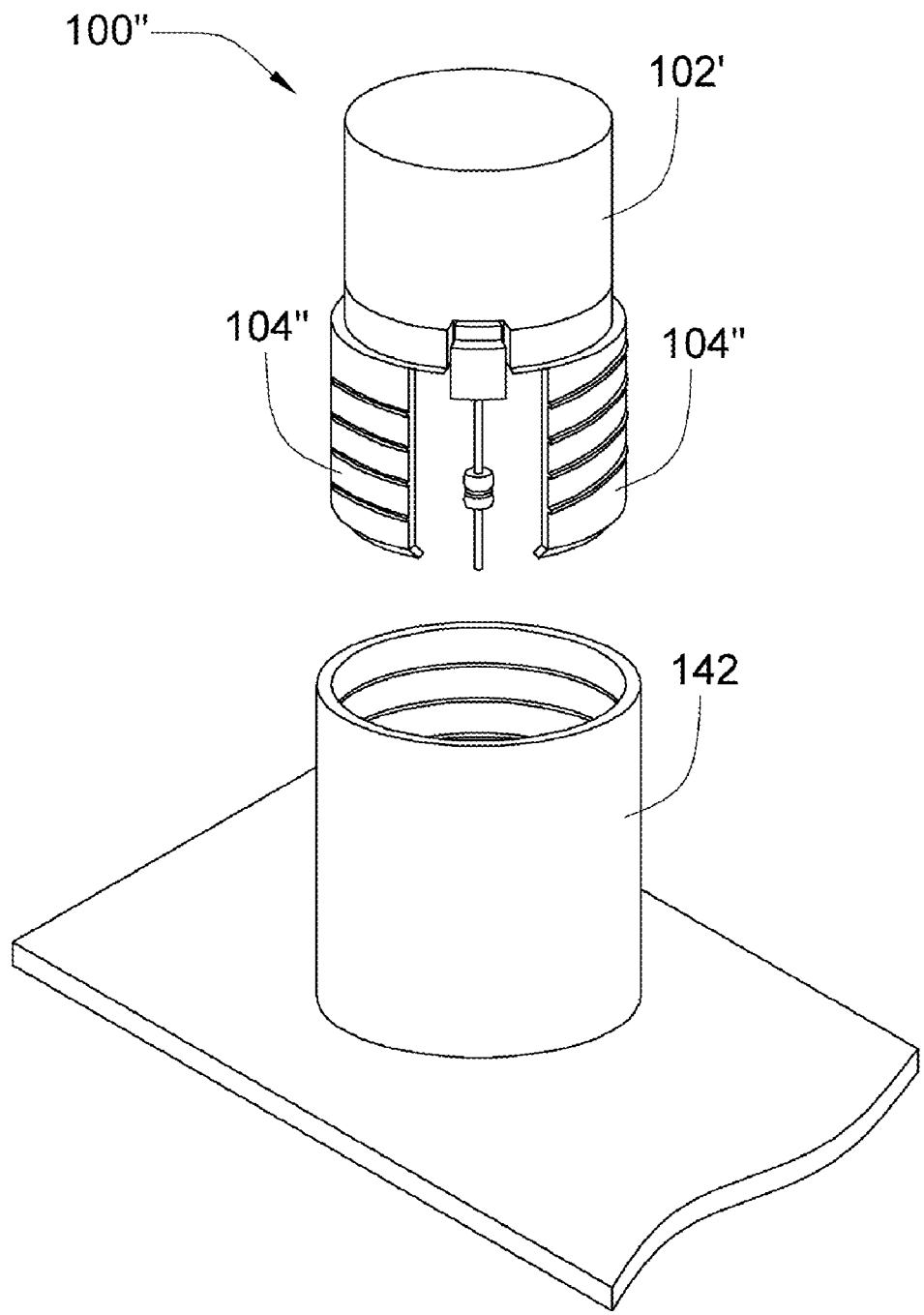
FIG. 1I shows a light emitting device capable of being installed on a lamp base.

Referring to FIG. 1I, a light emitting device capable of being installed on a lamp base is shown. Likewise, the light emitting device 100" has two leadframes 104" respectively disposed at two sides under the light emitting unit 102". The shape formed by the two leadframes 104" is the same as the shape of the lamp base 142 such as a spiral for example, such that the leadframe 104" can be screwed into the lamp base 142 to fix the light emitting device 100" in the lamp base 142.

Each of the above light emitting devices has multiple uses. Besides being used in most illumination devices, such as household lamp, street lamp, signboard and etc., the light emitting device of the disclosure can further be used as a light source in a backlight device. As the light emitting device has positioning function for assembly, the assembly of the backlight device is simpler and easier, and the disassembly of the backlight device is very flexible as disclosed below.

Referring to FIGS. 2A~2D, consecutive steps of assembling a backlight device are shown. Referring to FIG. 3, a flowchart of a method of assembling a light emitting device to a circuit board is shown. As shown in FIG. 3, the method of assembling a light emitting device includes steps S31~S33. Firstly, a light emitting unit and a leadframe of a light emitting device are aligned with an opening of a circuit board. Next, the leadframe is inserted into the opening. Then, the leadframe is moved continuously until the board body passes through the opening and is outside the circuit board, and the positioning arm of the leadframe wedges with the side wall of the opening so as to fix the light emitting unit on the circuit board.

Figure 2A:
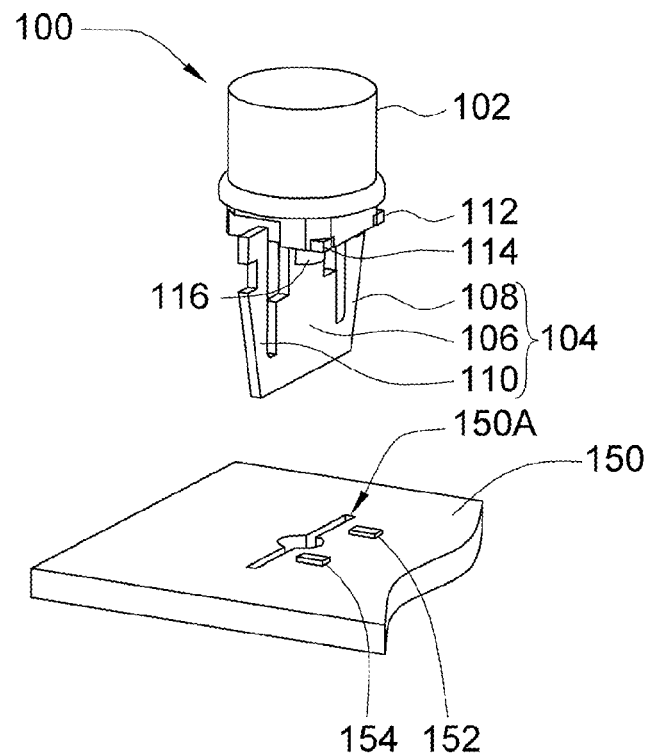
FIGS. 2A~2D show consecutive steps of assembling a backlight device.
Figure 3:
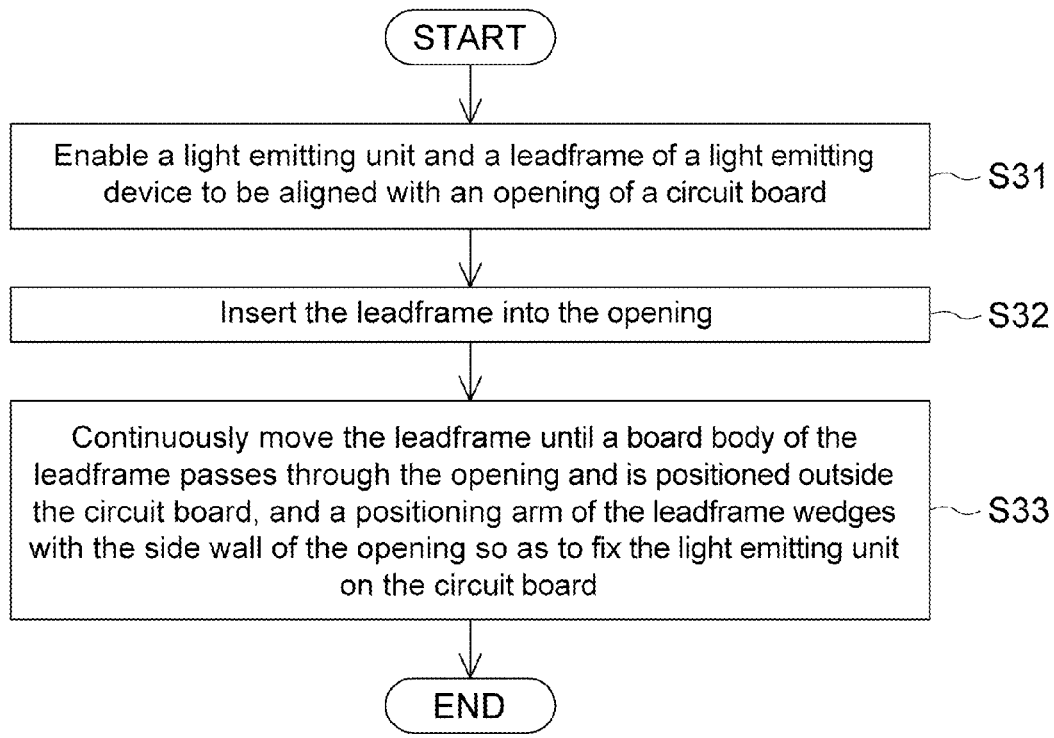
FIG. 3 shows a flowchart of a method of assembling a light emitting device and a circuit board.

As shown in FIG. 2A, the circuit board 150 of the backlight device has an opening 150A. The shape of the opening 150A substantially matches with the cross-section of the leadframe 104 of the light emitting device 100. Furthermore, the circuit board 150 has two electrode contact points 152 and 154 disposed for electrically connecting with the electrode pins 112 and 114 of the light emitting device 110.

In step S31, when the light emitting device 100 is assembled to the circuit board 150, the leadframe 104 must be aligned with the opening 150A and so are the positions of the electrode pins 112 and 114 be aligned with the electrode contact points 152 and 154 to assure that the light emitting device 100 and the circuit board 150 are electrically connected after assembly.

Figure 2B:
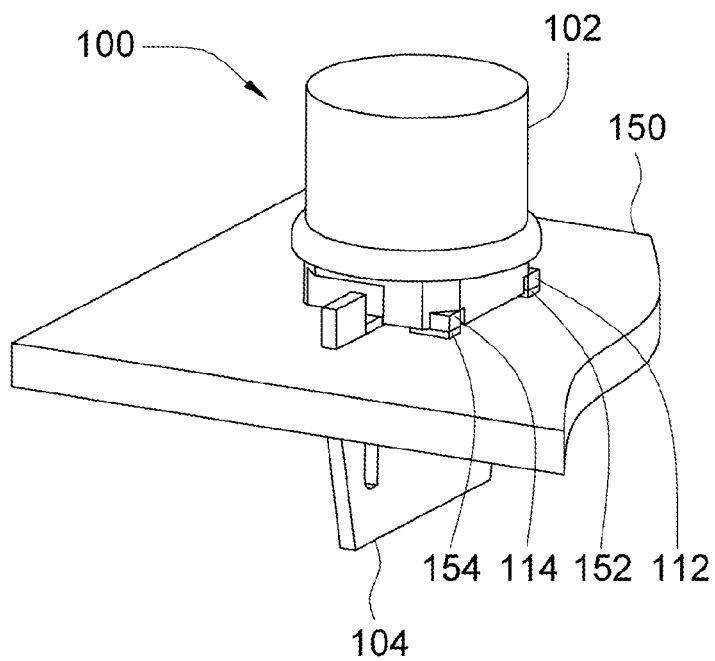
Figure 2C:
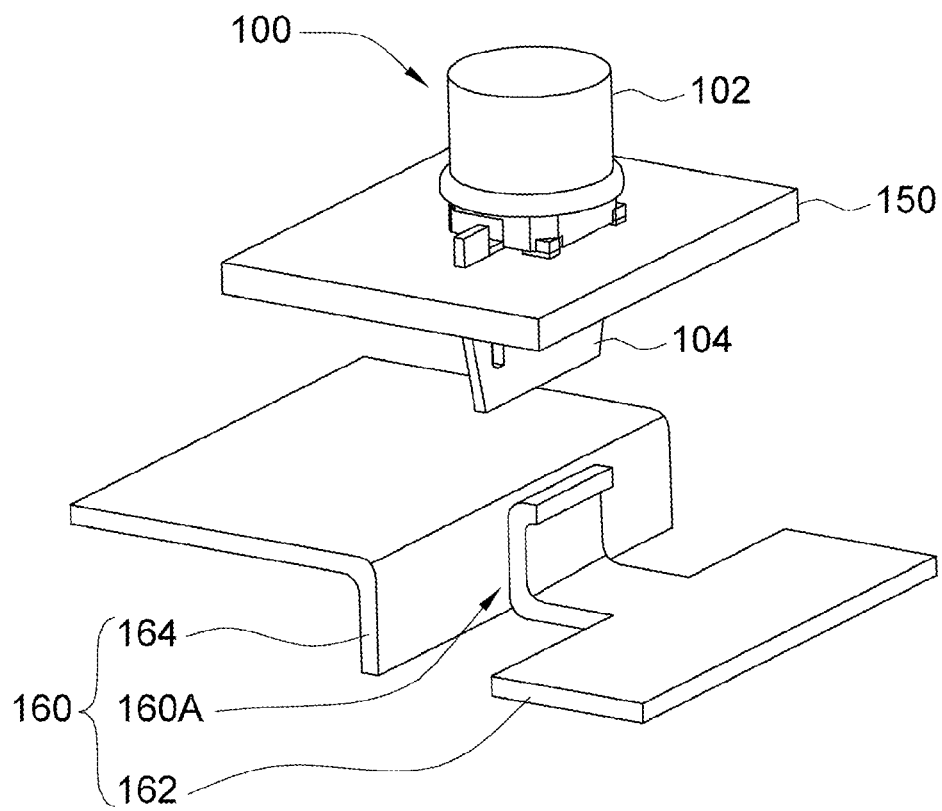

Next, as shown in step S32 and S33, the leadframe 104 is inserted into the opening 150A and is moved continuously until the positioning arms 108 and 110 of the leadframe 104 wedge with the circuit board 150. The positioning arms 108 and 110 have elasticity. During assembly, the positioning arms 108 and 110 are restricted by the opening 150A, so the positioning arms 108 and 110 having elasticity will be bent towards the board body 106 for enabling the leadframe 104 to be inserted into the opening 150A. As the leadframe 104 is moved for a distance such that the positioning recesses 108A and 110A (shown in FIG. 1A) of the positioning arms 108 and 110 correspond to the opening 150A, the restriction between the positioning arms 108 and 110 and the circuit board 150 is gone, and the positioning arms 108 and 110, due to their own elasticity, will be ejected outward to let the positioning recesses 108A and 110A wedge with the side wall of the opening 150A. Thus, the leadframe 104 positions the light emitting unit 102 on the circuit board 150, as shown in FIG. 2B.

Meanwhile, the electrode pins 112 and 114 are aligned with the electrode contact points 152 and 154. To ensure electrical connection between the light emitting device 100 and the circuit board 150, a soldering step can further be added during the assembly of the backlight device.

Preferably, a metal solder such as tin, lead and copper can be disposed at the electrode contact points 152 and 154. After the light emitting device 100 is assembled to the circuit board 150 as shown in FIG. 2B, the light emitting device 100 and the circuit board 150 are placed and heated in a heating device such as a tin furnace. As the volume of the electrode contact points 152 and 154 is very small, the solder on the electrode contact points 152 and 154 will be melted soon after being heated. Then, the electrode contact points 152 and 154 are connected with the electrode pins 112 and 114.

After the light emitting device 100 is assembled to the circuit board 150, only the light emitting unit 102 is exposed outside the circuit board 150, making the secondary assembly of other optical elements easier. Also, as the positioning arms 108 and 110 of the leadframe 104 possess elasticity, when one light emitting device 100 fails, the light emitting device 100 can be detached from the circuit board 150 such that a new light emitting device is replaced through a simple action of pressing. Thus, the assembly and disassembly of the light emitting device are indeed very easy and convenient.

Preferably, the backlight device further has a heat sink 160 (shown in FIG. 2C) for dissipating the heat off the light emitting device 100, thereby preventing the light emitting device 100 from being overheated. The heat sink 160 has a slot 160A constituted by two dissipation pieces 162 and 164. The two dissipation pieces 162 and 164 are bent in opposite directions. For example, the dissipation piece 162 is bent upward and the dissipation piece 164 is bent downward so as to constitute the slot 160A.

Figure 2D:
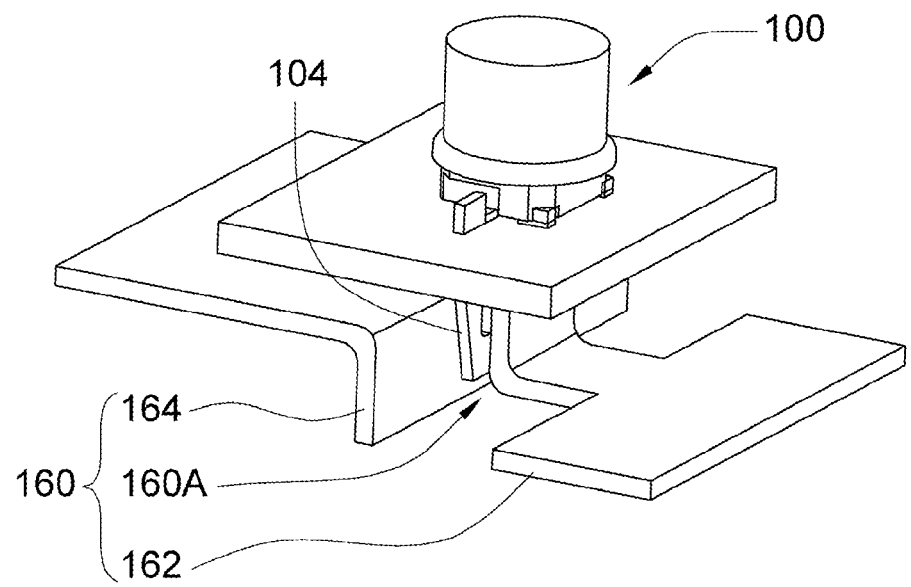

The leadframe 104 of the light emitting device 100 passes through the circuit board 150 and is partly outside the circuit board 150. The leadframe 104 can be inserted into the slot 160A of the heat sink 160. Preferably, the leadframe 104 and the slot 160A are tightly coupled such that there is direct contact between the leadframe 104 and the two dissipation pieces 162 and 164 as shown in FIG. 2D. Thus, the heat generated during the operation of the light emitting unit 102 is transmitted to the heat sink 160 rather than to the circuit board 150 via the leadframe 104, such that the circuits on the circuit board 150 will not be damaged due to high temperature. For example, electronic elements disposed on the circuit board 150 will not be aged due to high temperature.

Figure 2E:
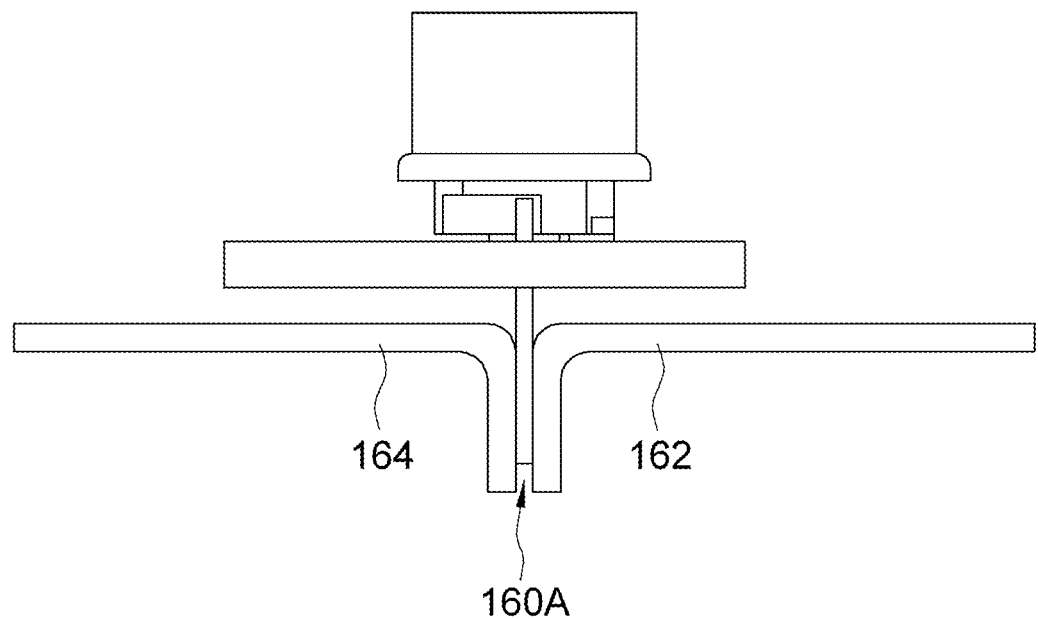
FIGS. 2E and 2F are cross-sectional views showing two dissipation pieces of a heat sink being bent in the same direction.
Figure 2F:
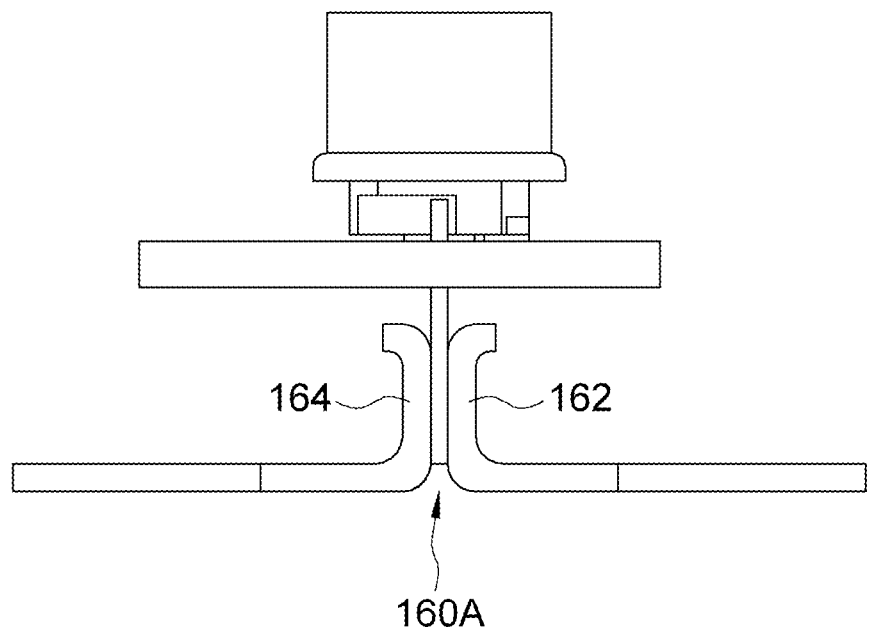

Despite the heat sink 160 is exemplified by two dissipation pieces 162 and 164 bent in opposite directions, the heat sink 160 is not limited thereto. Referring to FIGS. 2E and 2F, cross-sectional views of two dissipation pieces of a heat sink being bent in the same direction are shown. The slot 160A can be constituted by the dissipation pieces 162 and 164 both bent downward as shown in FIG. 2E or by the dissipation pieces 162 and 164 both bent upward as shown in FIG. 2F. The dissipation pieces 162 and 164 can be integrally formed in one piece from the same plate.

Figure 2G:
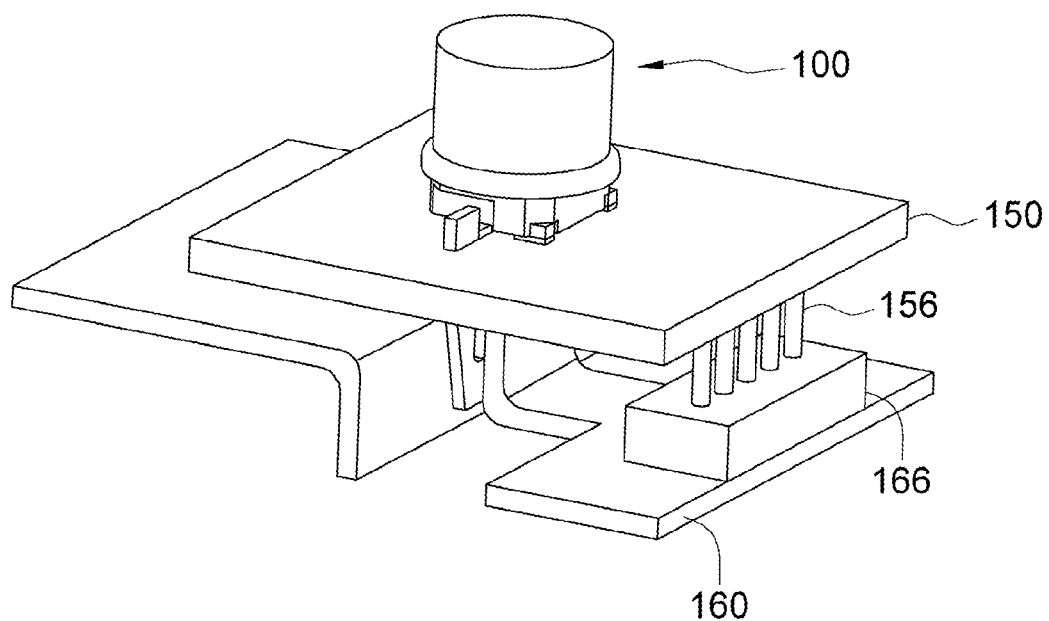
FIG. 2G shows a heat sink being electrically connected to a circuit board.

Referring to FIG. 2G, a heat sink being electrically connected to a circuit board is shown. The heat sink 160 has a power-supplying end electrically connected to the circuit board 150 for supplying power to the light emitting device 100. As shown in FIG. 2G, the power-supplying end can be a power socket 166, and the circuit board 150 can be a plug pin 156. When assembling the light emitting device 100 to the heat sink 160, the plug pin 156 can be plugged into the power socket 166 at the same time for electrically connecting the heat sink 160 with the circuit board 150.

Figure 2H:
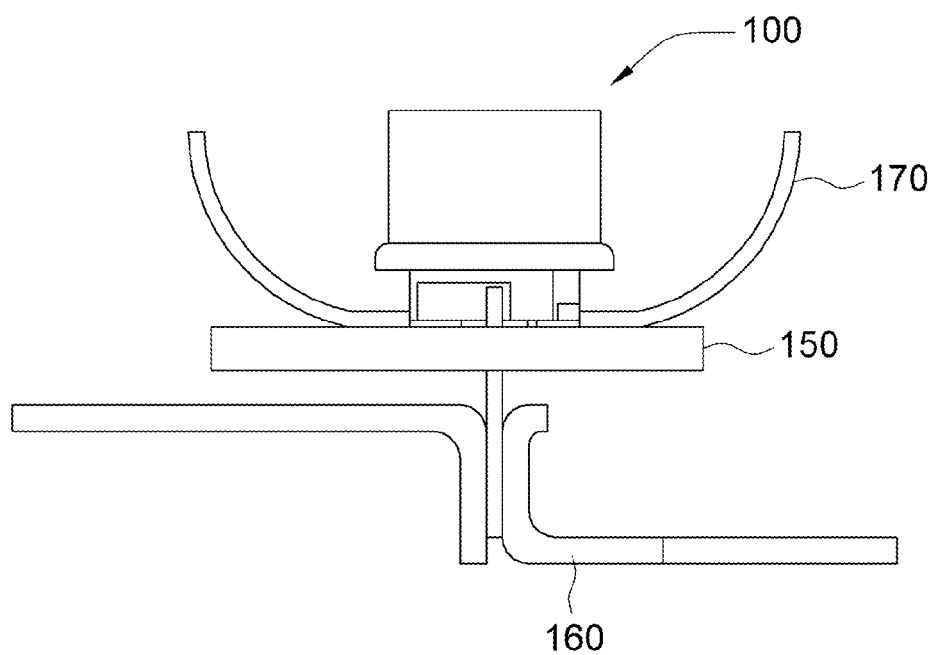
FIG. 2H shows a circuit board having a reflector disposed thereon.

Referring to FIG. 2H, a circuit board having a reflector disposed thereon is shown. Preferably, a reflector 170 is disposed on the circuit board 150 and is positioned around the light emitting device 100 for controlling the light emitting direction of the light emitting device 100.

According to the light emitting device 100 of the present embodiment of the disclosure, the leadframe 104 being planar can conveniently pass through the circuit board 150 and directly inserted into the heat sink 160 under the circuit board 150 so as to effectively isolate the heat-dissipation system from the circuit system, such that the lifespan of the light emitting device is prolonged. The heat-dissipation system includes the leadframe 104 and the heat sink 160, and the circuit system includes the light emitting unit 102 and the circuit board 150. The positioning arms 108 and 110 of the leadframe 104, possessing elasticity and having two positioning recesses 108A and 110A, can be precisely positioned with the circuit board 150 after the leadframe 104 is inserted into the circuit board 150. The light emitting device 100 of the present embodiment of the disclosure has a package structure that is easy to manufacture. After the light emitting device 100 is positioned, circuit reliability is further increased by way of soldering the light emitting device 100 and the circuit board 150. Therefore, it is assured that the electronic products have sufficient reliability if the light emitting device 100 is used in electronic products with middle to high voltage.

Figure 4A:
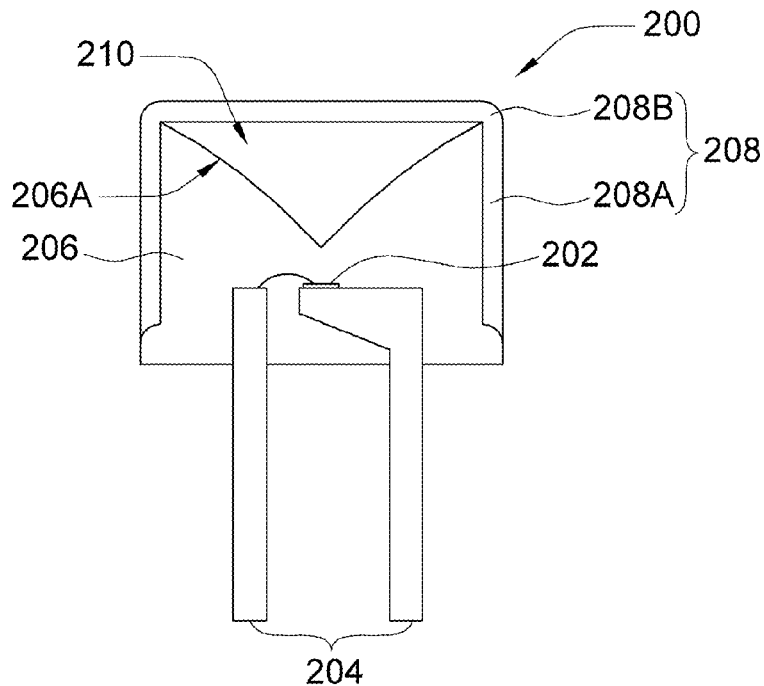
FIG. 4A shows a light emitting device with uniformed luminance according to a preferred embodiment of the disclosure.

Referring to FIG. 4A, a light emitting device with uniformed luminance according to a preferred embodiment of the disclosure is shown. The light emitting device 200 includes a light emitting unit 202, a leadframe 204, a transparent encapsulant 206 and a fluorescent colloid layer 208. The light emitting unit 202 is disposed on the leadframe 204. The transparent encapsulant 206 covers the light emitting unit 202 and has a concave on its outer surface. The transparent encapsulant 206 has at least one reflective surface 206A in the concave. The fluorescent colloid layer 208 is disposed outside the transparent encapsulant 206 and forms an air chamber 210 with the concave of the transparent encapsulant 206. The reflective surface 206A of the transparent encapsulant 206 is for guiding the light generated by the light emitting unit 202 to a side wall 208A of the fluorescent colloid layer 208. The fluorescent colloid layer 208 and the transparent encapsulant 206 can be manufactured as a cylinder so that the side wall 208A looks like a ring light-emitting area.

Preferably, the concave of the transparent encapsulant 206 is positioned above the light emitting unit 202, and the shape of the concave is an inverted cone whose apex corresponds to the light emitting unit 202. Preferably, the reflective surface 206A is an arc-shaped surface.

Figure 4B:
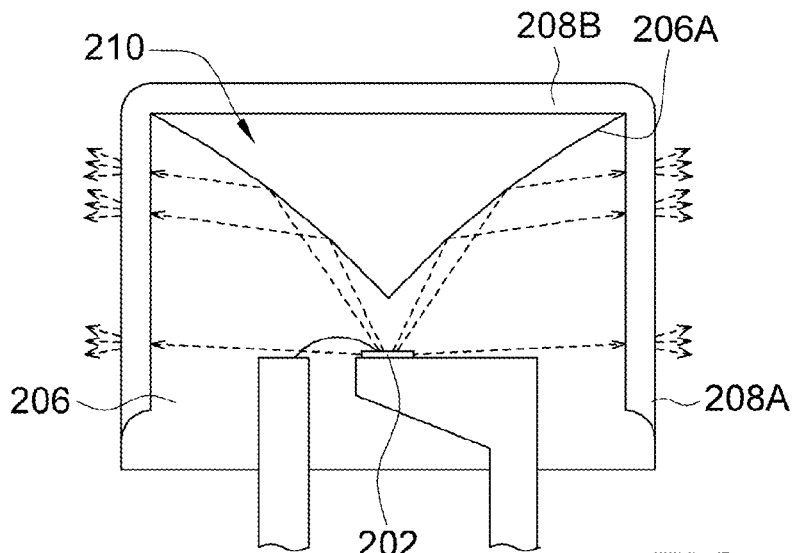
FIG. 4B shows an enlargement of a light emitting device of FIG. 4A during operation.

Referring to FIG. 4B, an enlargement of a light emitting device of FIG. 4A during operation is shown. As shown in FIG. 4B, the refractive index of the transparent encapsulant 206 is different from that of the air inside the air chamber 210, hence generating total reflection. Let the refractive index of the transparent encapsulant 206 be 1.5 and the refractive index of the air inside the air chamber 210 be 1 for example. When the light generated by the light emitting unit 202 is transmitted to the reflective surface 206A, total reflection will occur as the light is transmitted from the transparent encapsulant 206 whose refractive index is large to the air whose refractive index is small. Thus, a part of the light generated by the light emitting unit 202 passes through the transparent encapsulant 206 and reaches the top 208B of the fluorescent colloid layer 208, and most of the light generated by the light emitting unit 202 is guided to the side wall 208A of the fluorescent colloid layer 208 and interacts with the fluorescent powder of the fluorescent colloid layer 208 to generate fluorescent lights. Also, a thin film having high reflective index or a metal plating film can be disposed on the reflective surface 206A.

The fluorescent colloid layer 208 can be a film layer with a uniformed thickness. As shown in FIG. 4B, as the light generated by the light emitting unit 202 will be guided to the side wall 208A of the fluorescent colloid layer 208, preferably, the thickness of the side wall 208A of the fluorescent colloid layer 208 is larger than that of the top 208B of the fluorescent colloid layer 208 or the fluorescent powder concentration of the side wall 208A of the fluorescent colloid layer 208 is larger than that of the top 208B of the fluorescent colloid layer 208. Thus, the efficiency of fluorescent conversion is enhanced, and the light mixing ratio of the light generated by the light emitting unit 202 to the light converted by the fluorescent colloid layer 208 is better controlled.

In the present embodiment of the disclosure, the light emitting unit 202 of is an LED chip for example, and the material of the fluorescent powder of the fluorescent colloid layer 208 is determined according to the desired color of the light to be produced. For example, if the light emitting device 200 is to produce a white light, then a blue LED chip is used as a light emitting unit 202, and a fluorescent colloid layer 208 made from yellow fluorescent powder is used to work with the blue LED chip. Thus, when the blue light generated by the blue LED chip is guided to the fluorescent colloid layer 208, the blue light will firstly excite the yellow fluorescent powder to produce a yellow light, and a white light will be produced when the yellow light is mixed with the blue light. Also, the light emitting device can produce a white light by mixing the ultra-velvet (UV) light emitted by a light emitting unit and red, green and blue light generated by corresponding fluorescent powders.

Figure 5A:
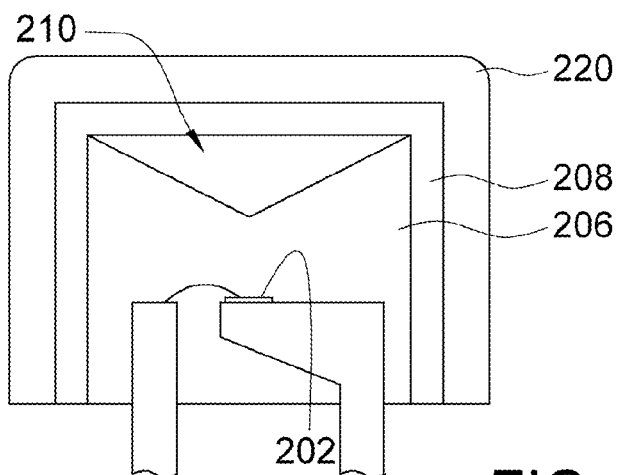
FIGS. 5A and 5B show a light emitting device having a transparent colloid layer.
Figure 5B:
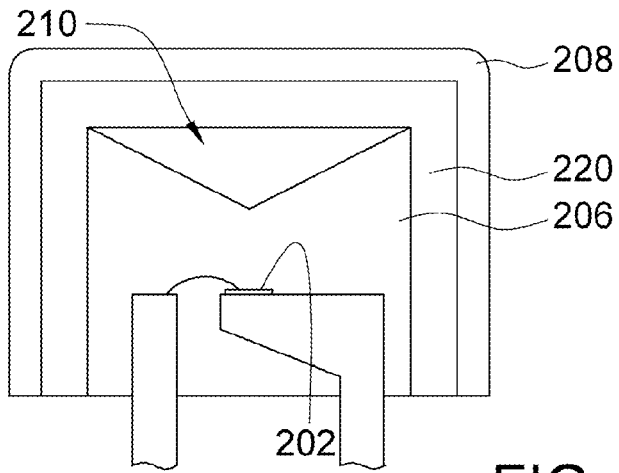

The light emitting device 200 can have other structures. Referring to FIGS. 5A and 5B, diagrams of a light emitting device having a transparent colloid layer are shown. As shown in FIG. 5A, the transparent colloid layer 220 is disposed outside the fluorescent colloid layer 208 for protecting the fluorescent colloid layer 208. As shown in FIG. 5B, the transparent colloid layer 220 can be disposed outside the transparent encapsulant 206 to form an air chamber 210 first, and then the fluorescent colloid layer 208 is disposed outside the transparent colloid layer 220 next.

Figure 5C:
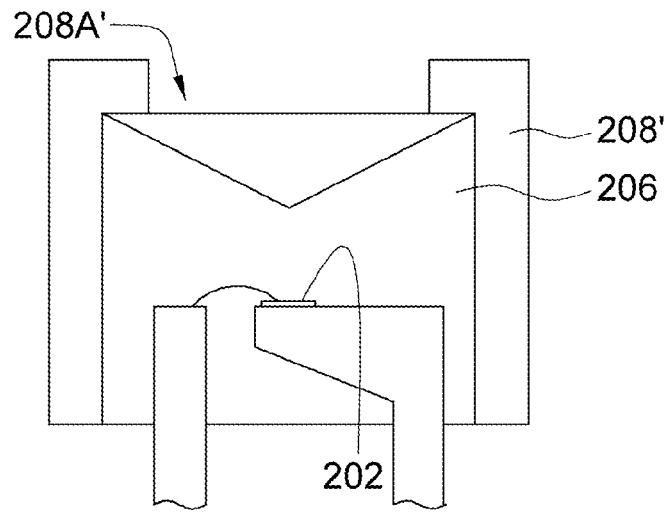
FIG. 5C shows a fluorescent colloid layer having an opening at the top.
Figure 5D:
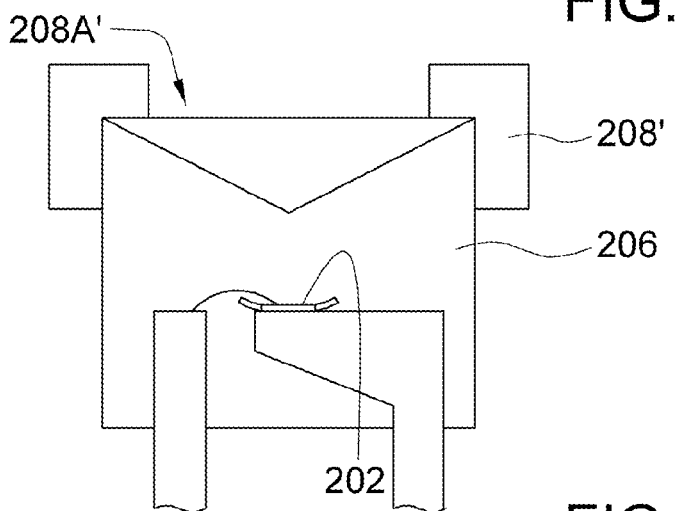
FIG. 5D shows a fluorescent colloid layer of FIG. 5C not completely covering a transparent encapsulant.
Figure 5E:
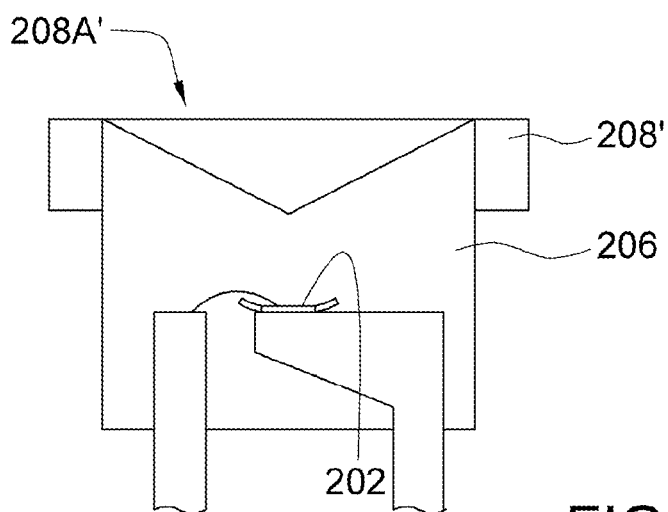
FIG. 5E shows a fluorescent colloid layer of FIG. 5D merely covering the transparent encapsulant.
Figure 5F:
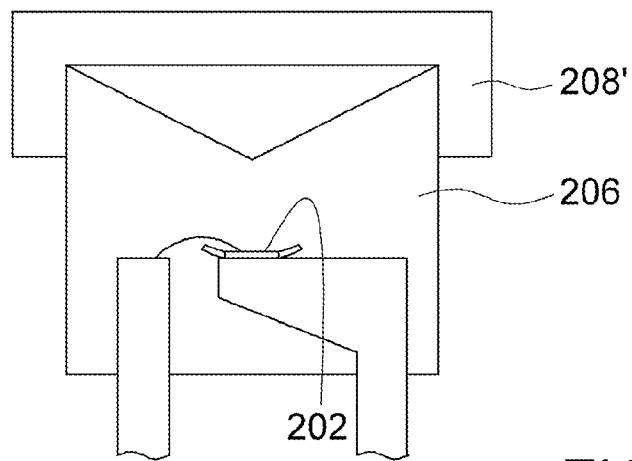
FIG. 5F shows a fluorescent colloid layer of FIG. 5D covering the concave of the transparent encapsulant.

The fluorescent colloid layer of the present embodiment of the disclosure can have other forms of structures disclosed below with accompanying drawings. Referring to FIG. 5C, a fluorescent colloid layer having an opening at the top is shown. As most of the light generated by the light emitting unit 202 is guided to the side wall of the fluorescent colloid layer 208', an opening 208A' is formed at the top of the fluorescent colloid layer 208' so as to save fluorescent powder material. The opening 208A' corresponds to the position of the concave of the transparent encapsulant 206, and preferably, the size of the opening 208A' is about the same as the concave. Referring to FIG. 5D, a fluorescent colloid layer of FIG. 5C not completely covering a transparent encapsulant is shown. As the fluorescent colloid layer 208' only covers a part of the side wall of the transparent encapsulant 206, a part of the light emitted by the light emitting unit 202 will directly pass through the transparent encapsulant 206, and another part of the light will excite the fluorescent colloid layer 208' such that versatile light-mixing effect is generated. Next, referring to FIG. 5E, a fluorescent colloid layer of FIG. 5D merely covering the transparent encapsulant is shown. As shown in FIG. 5E, the fluorescent colloid layer 208' is disposed along a part of the side wall of the transparent encapsulant 206, such that the size of the opening of the fluorescent colloid layer 208' is about the same as the size of the concave of the transparent encapsulant 206. Referring to FIG. 5F, a fluorescent colloid layer of FIG. 5D covering the concave of a transparent encapsulant is shown. The fluorescent colloid layer 208' can also be directly disposed above the transparent encapsulant 206 so as to form an air chamber with the concave of the transparent encapsulant 206.

Figure 5G:
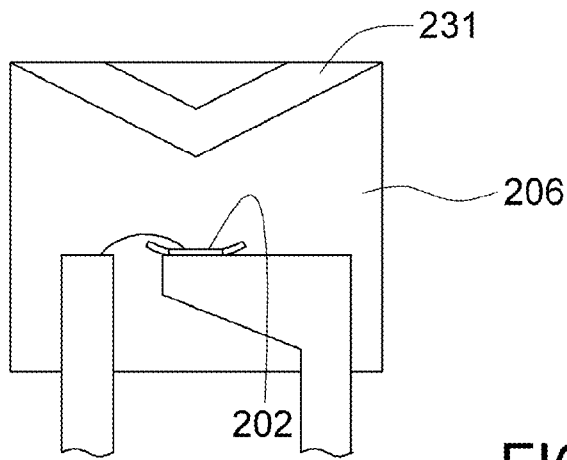
FIGS. 5G~5I show a light emitting device having a reflective structure disposed therein.
Figure 5H:
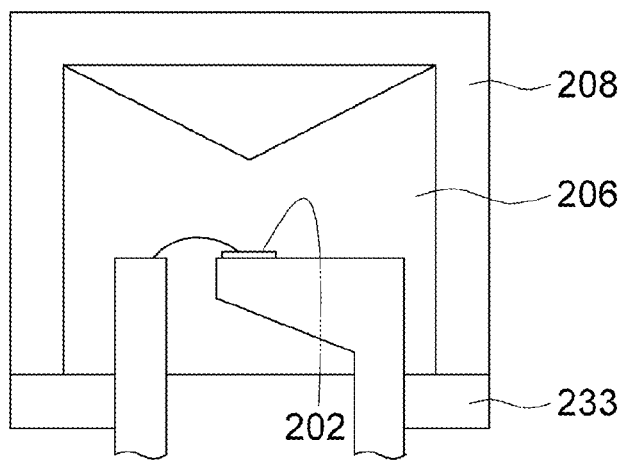
Figure 5I:
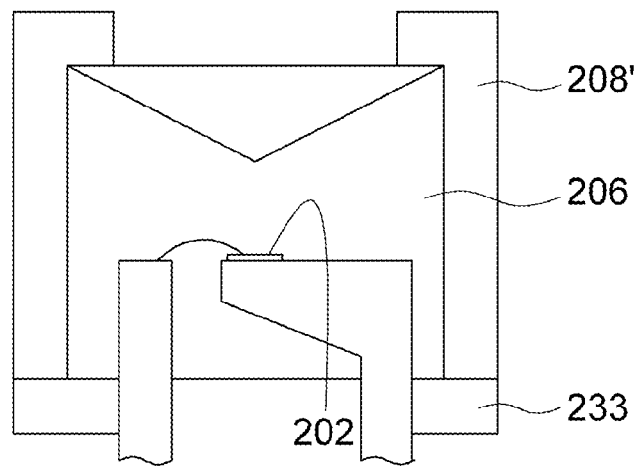

To increase the light emitting efficiency of the lighting device, a reflective structure can be disposed on the transparent encapsulant 206 as disclosed below with accompanying drawings. Referring to FIGS. 5G~5I, diagrams of a light emitting device having a reflective structure disposed therein are shown. As shown in FIG. 5G, a conic reflective structure 231 is disposed on the reflective surface of the transparent encapsulant 206. The light generated by the light emitting unit 202 will be directly reflected by the reflective structure 231 and emitted from the side wall of the transparent encapsulant 206. As shown in FIG. 5H, 5I, a reflective structure 233 is disposed under the light emitting unit 202 and the transparent encapsulant 206 to avoid the light of the light emitting unit 202 being leaked from underneath.

Figure 5J:
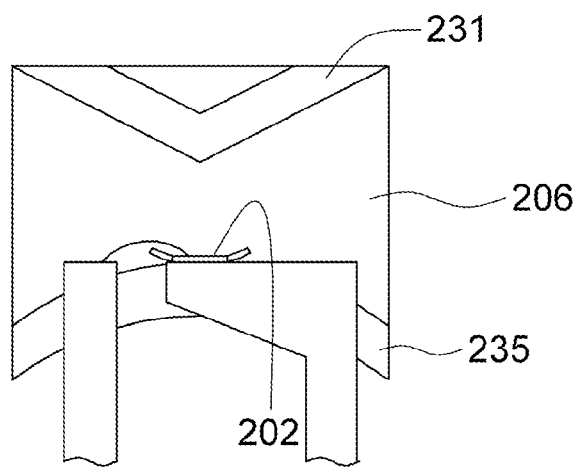
FIGS. 5J~5P show variations of a reflective structure.
Figure 5K:
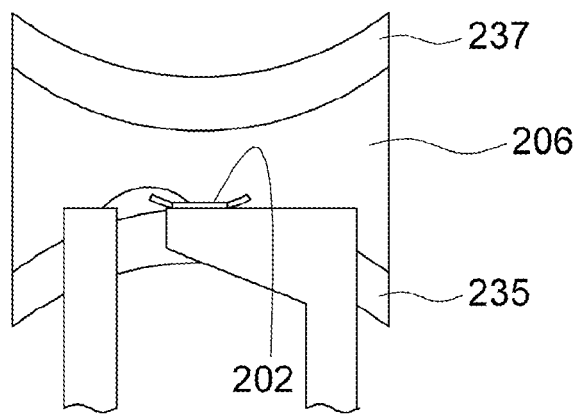
Figure 5L:
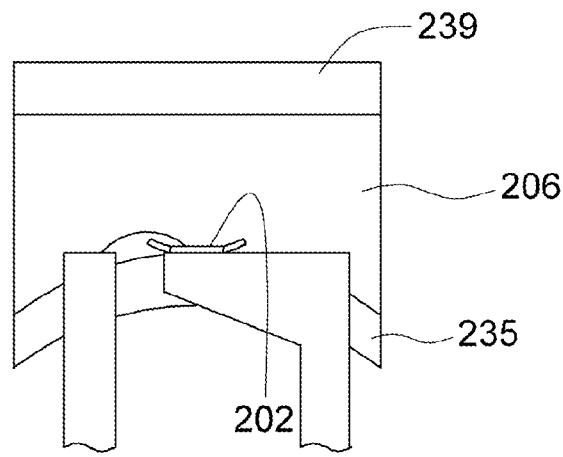
Figure 5M:
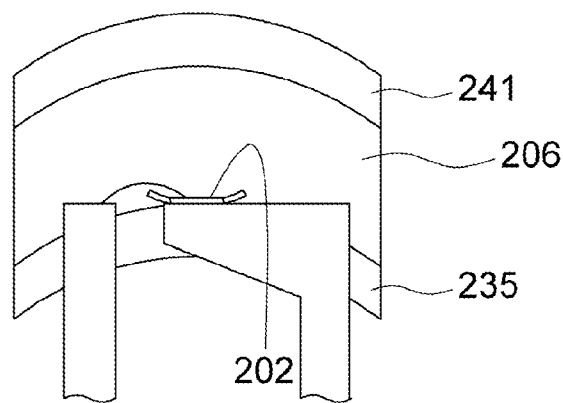
Figure 5N:
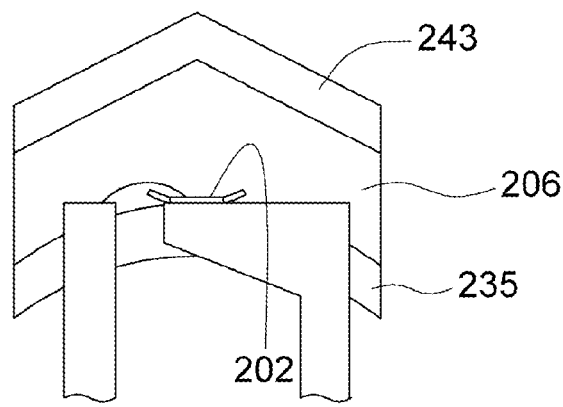
Figure 5O:
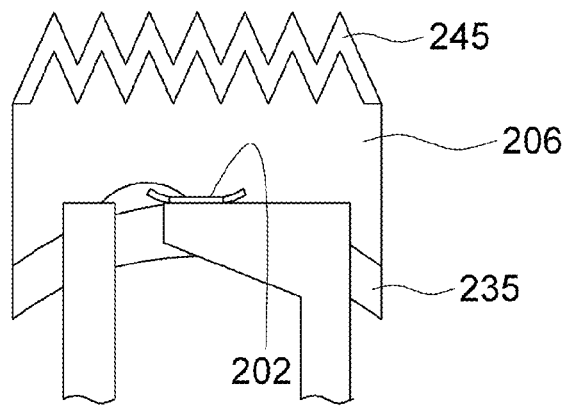
Figure 5P:
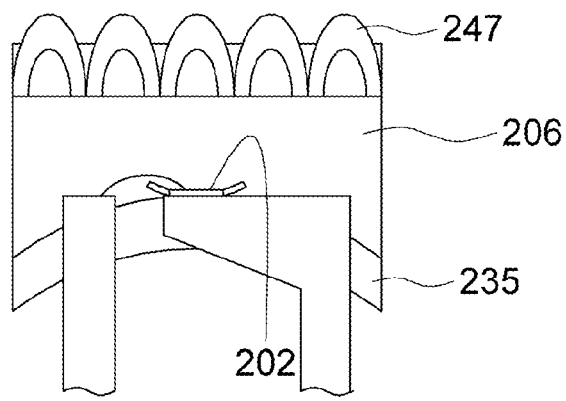
Figure 5Q:
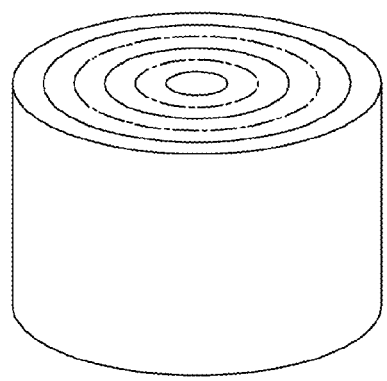
FIGS. 5Q and 5R respectively show the reflective structures being arranged as a concentric circle and a parallel structure.
Figure 5R:
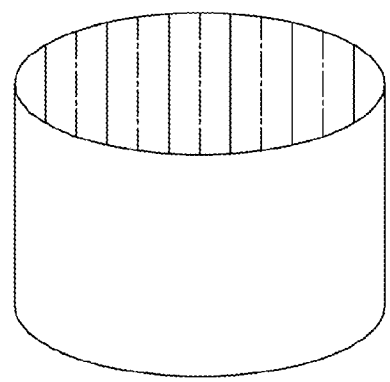

Referring to FIGS. 5J~5P, variations of a reflective structure are shown. As shown in FIG. 5J, reflective structures 231 and 235 are respectively disposed at the top and the bottom of the transparent encapsulant 206. The reflective structure 235 is an arc-shaped structure formed along the bottom of the transparent encapsulant 206. As shown in FIG. 5K, two arc-shaped reflective structures 237 and 235 are respectively formed at the top and the bottom of the transparent encapsulant 206, wherein reflective structures 237 and 235 are disposed with the protrusions facing each other. As shown in FIG. 5L, a planar reflective structure 239 is disposed at the top of the transparent encapsulant 206, and an arc-shaped reflective structure 235 is disposed at the bottom. As shown in FIG. 5M, an arc-shaped reflective structure 241 is disposed at the top of the transparent encapsulant 206, and an arc-shaped reflective structure 235 is disposed at the bottom, wherein the deposition of the reflective structures 241 and 235 is similar to that a concave faces a convex. As shown in FIG. 5N, a conic reflective structure 243 is disposed at the top of the transparent encapsulant 206, and an arc-shaped reflective structure 235 is disposed at the bottom. As shown in FIG. 5O, a reflective structure 245 having a saw-tooth cross-section is disposed at the top of the transparent encapsulant 206. As shown in FIG. 5P, a reflective structure 247 whose cross-section has multiple arcs is disposed at the top of the transparent encapsulant 206. The reflective structures 245 and 247, which are chainsaw-shaped or multi-arced are illustrated in FIGS. 5Q and 5R. The reflective structures 245 and 247 can be arranged as a concentric circle as shown in FIG. 5Q, or be arranged in parallel as shown in FIG. 5R. The above reflective structures can be a metal plating film or a thin film having high reflective index.

Figure 5S:
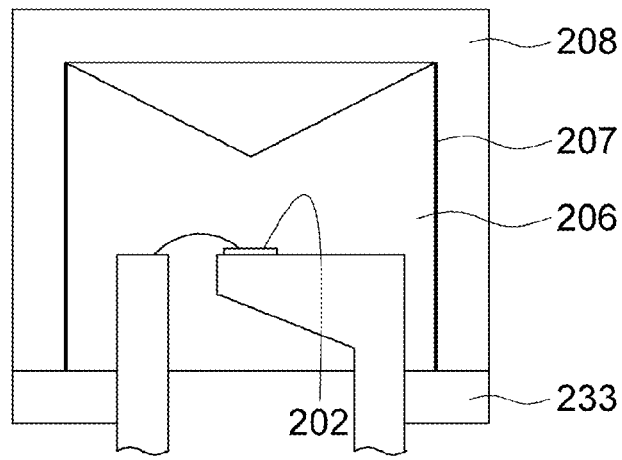
FIG. 5S shows a gap layer material being interposed between a transparent encapsulant and a fluorescent colloid layer.

Let the structure of the fluorescent colloid layer 208 be formed first, and then the fluorescent colloid layer 208 be disposed on the transparent encapsulant 206 next. As a gap is easily formed between the transparent encapsulant 206 and the fluorescent colloid layer 208 and affects the emitting of the light, a gap layer material 207 is interposed between the transparent encapsulant 206 and the fluorescent colloid layer 208 as shown in FIG. 5S. Preferably, the refractive index of the gap layer material 207 is close to that of the transparent encapsulant 206 and the fluorescent colloid layer 208 to avoid the total reflection occurring in the gap between the transparent encapsulant 206 and the fluorescent colloid layer 208.

Figure 5T:
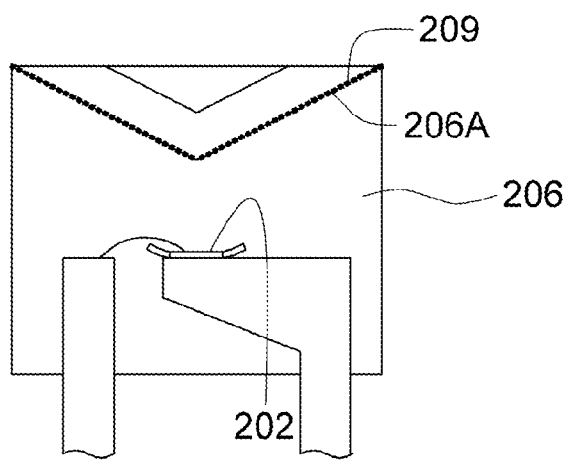
FIG. 5T shows a roughened structure being formed on a reflective surface of a transparent encapsulant.
Figure 5U:
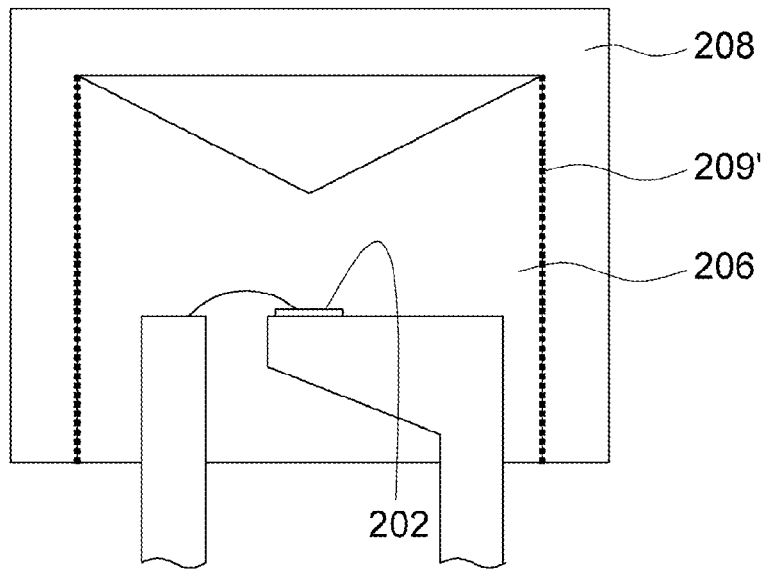
FIG. 5U shows a roughened structure being interposed at the junction between a transparent encapsulant and a fluorescent colloid layer.

To increase the efficiency of the reflective surface 206A of the transparent encapsulant 206 in guiding the light to the fluorescent colloid layer 208, a roughened structure 209 is designed on the reflective surface 206A as shown in FIG. 5T. As shown in FIG. 5U, a roughened structure 209' can be formed in the junction between the transparent encapsulant 206 and the fluorescent colloid layer 208. The roughened structure 209' can be directly formed on the outer surface of the structure of the transparent encapsulant 206. The roughened structure 209' can be formed on the inner side wall of the fluorescent colloid layer 208 first, and then the fluorescent colloid layer 208 is disposed on the transparent encapsulant 206. The design of the roughened structures 209 and 209' can be used in FIGS. 5D~5G and FIGS. 5J~5P disclosed above.

Figure 6:
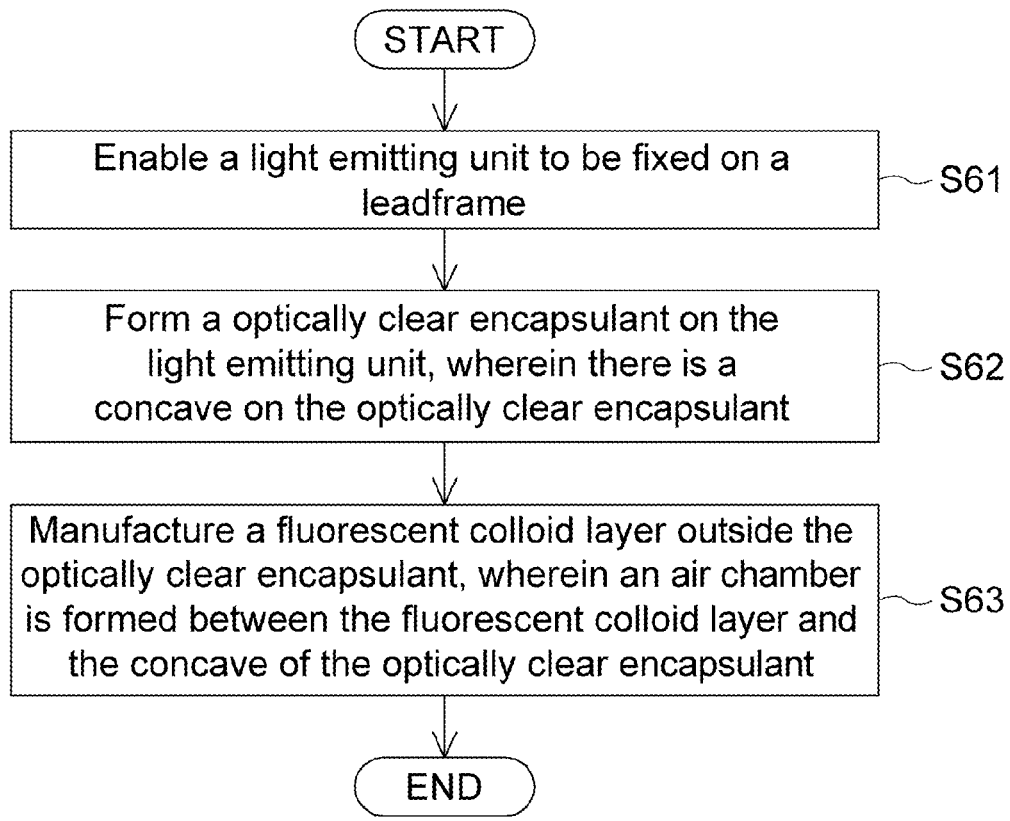
FIG. 6 shows a flowchart of a method of assembling a light emitting device of FIG. 4A.

The method of manufacturing light emitting device 200 is disclosed below. Referring to FIG. 6, a flowchart of a method of assembling a light emitting device of FIG. 4A is shown. The method of manufacturing light emitting device 200 includes steps S61~S63. Firstly, a light emitting unit is fixed on a leadframe. Next, a transparent encapsulant is formed on the light emitting unit, and there is an concave disposed on the outside structure of the transparent encapsulant. Then, a fluorescent colloid layer is manufactured outside the transparent encapsulant, and the fluorescent colloid layer forms an air chamber with the concave of the transparent encapsulant.

Figure 7A:
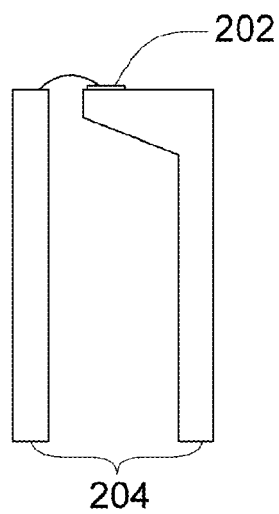
FIGS. 7A~7D show consecutive steps of assembling a light emitting device of FIG. 4A.

Referring to FIGS. 7A~7D, consecutive steps of assembling a light emitting device of FIG. 4A are shown. As shown in FIG. 7A, the method begins at step S61, the light emitting unit 202 is manufactured on the leadframe 204 by way of chip wire bonding.

Figure 7B:
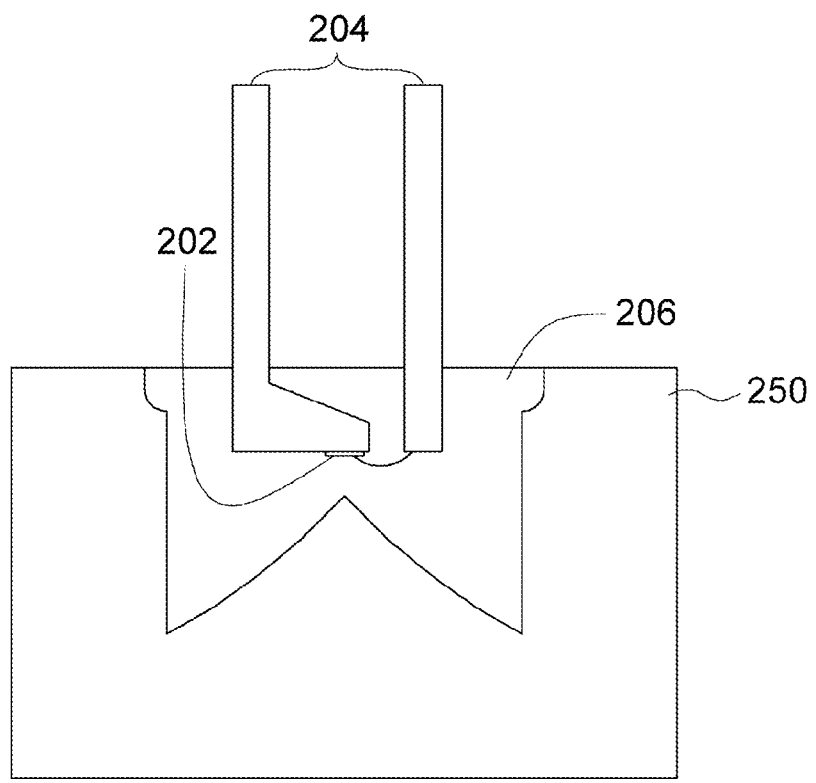
Figure 7C:
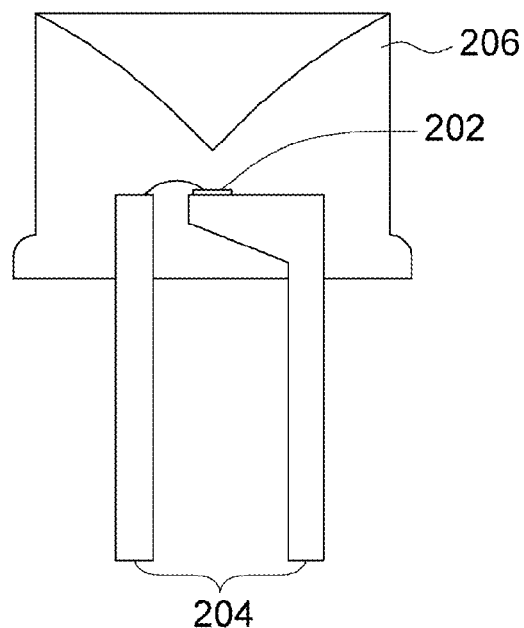

Next, the method proceeds to step S62 of manufacturing the transparent encapsulant 206. During the manufacturing of the transparent encapsulant 206, mold cavities are used to assist shaping the material of the transparent encapsulant 206 on the light emitting unit 202 and the leadframe 204. Firstly, the material of the transparent encapsulant 206 is poured into the first mold cavity 250 as shown in FIG. 7B. The shape of the inner cavity of the first mold cavity 250 is the outer shape of the transparent encapsulant 206. Next, the leadframe 204 together with the light emitting unit 202 are inverted and placed into the first mold cavity 250. Then, the material of the transparent encapsulant 206 is baked and then is hardened, so as to combine with the light emitting unit 202 and the leadframe 204. After that, step S62 is completed as the first mold cavity 250 is removed as shown in FIG. 7C.

Figure 7D:
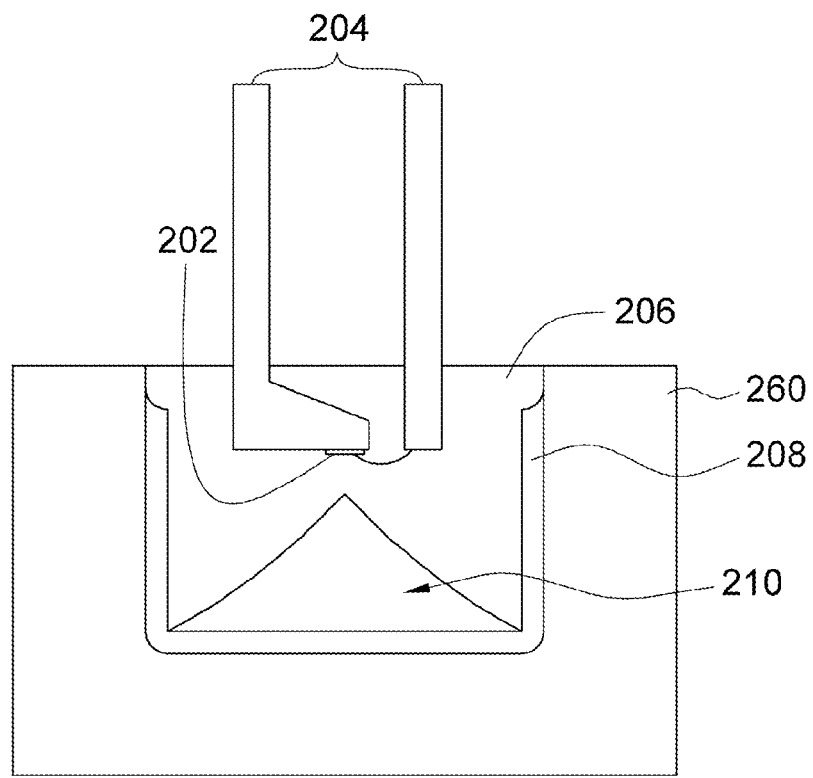

Then, the method proceeds to step S63 of manufacturing the fluorescent colloid layer 208. Step S63 is similar to step S62. Firstly, the material of the fluorescent colloid layer 208 is interposed into the second mold cavity 260 as shown in FIG. 7D. Next, the leadframe 204, the light emitting unit 202 and the transparent encapsulant 206 of FIG. 7C are inverted and placed in the second mold cavity 260. Meanwhile, an air chamber 210 is naturally formed between the concave of the transparent encapsulant 206 and the fluorescent colloid layer 208. Then, after the process of baking and mold removing, the material of the fluorescent colloid layer 208 is shaped outside the transparent encapsulant 206 as shown in FIG. 4A.

Alternatively, the fluorescent colloid layer 208 can be manufactured first, and then disposed on the transparent encapsulant 206.

The thickness of the fluorescent colloid layer 208 can be controlled through the manufacturing of the mold. When the fluorescent colloid layer 208 works with the transparent encapsulant 206, the light can be effectively mixed to improve color uniformity. Furthermore, by appropriately increasing the thickness of the fluorescent colloid layer 208, the luminance of the light will be decreased.

To dispose an extra transparent colloid layer 220 in the light emitting device 200 as shown in FIGS. 5A~5B, the extra transparent colloid layer 220 can be manufactured after the step S63 of manufacturing the fluorescent colloid layer 208, or, the transparent colloid layer 220 is manufactured immediately after the step S62 of manufacturing the transparent encapsulant 206 so as to form a closed air chamber 210 before the method proceeds to step S63.

In FIGS. 5C~5E, the fluorescent colloid layer 208' with the opening 208A' is manufactured through appropriate structural changes of the second mold cavity 260 as shown I FIG. 7D. For example, a protruding structure is formed on the bottom surface of the second mold cavity 260, such that the material of the fluorescent colloid layer 208' does not fill up the bottom surface of the second mold cavity 260, and the fluorescent colloid layer 208' having the opening 208A' will be manufactured in subsequent process.

Figure 8A:
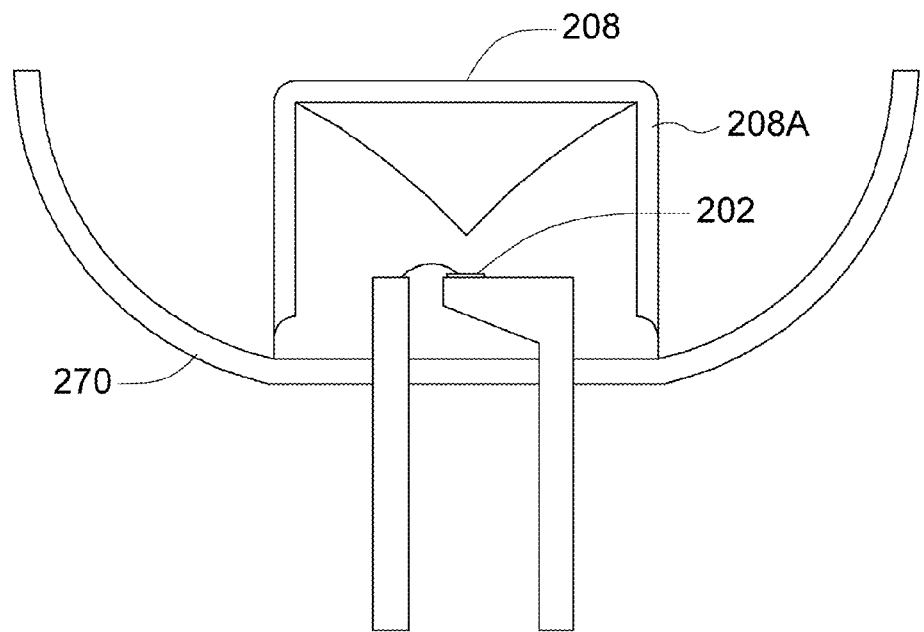
FIG. 8A shows a light emitting device of FIG. 4A having a bowl-shaped reflector.
Figure 8B:
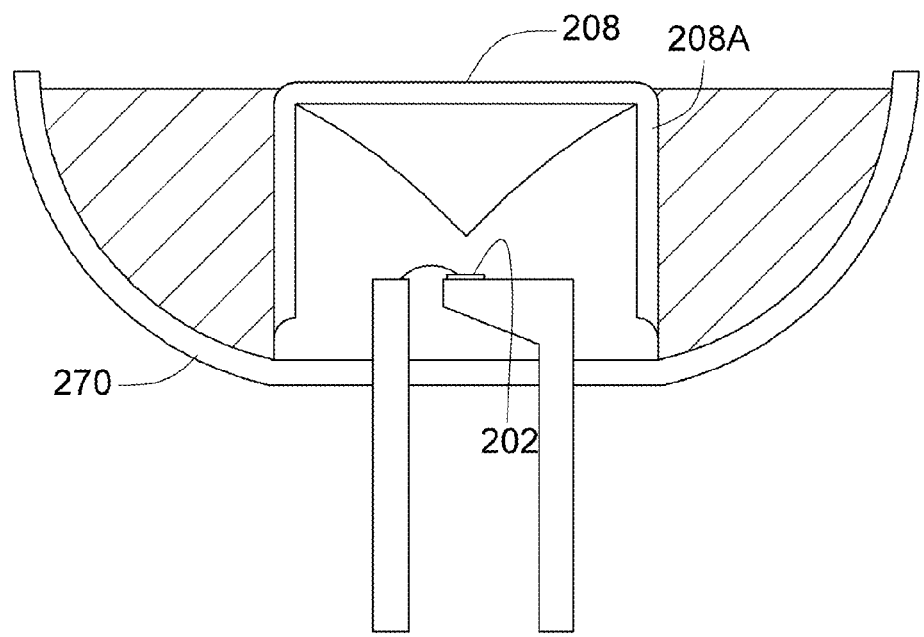
FIG. 8B shows the reflector of FIG. 8A being filled up with a material.

Referring to FIG. 8A, a light emitting device of FIG. 4A having a bowl-shaped reflector is shown. When the light is projected from the side wall 208A of the fluorescent colloid layer 208, the desired light shape can be achieved by appropriately combining with the secondary optical elements. For example, a bowl-shaped reflector 270 is disposed under the light emitting unit 202. Referring to FIG. 8B, a reflector of FIG. 8A being filled up with a material is shown. The slanted area of the drawing can be filled with transparent colloid or fluorescent powder colloid.

Figure 8C:
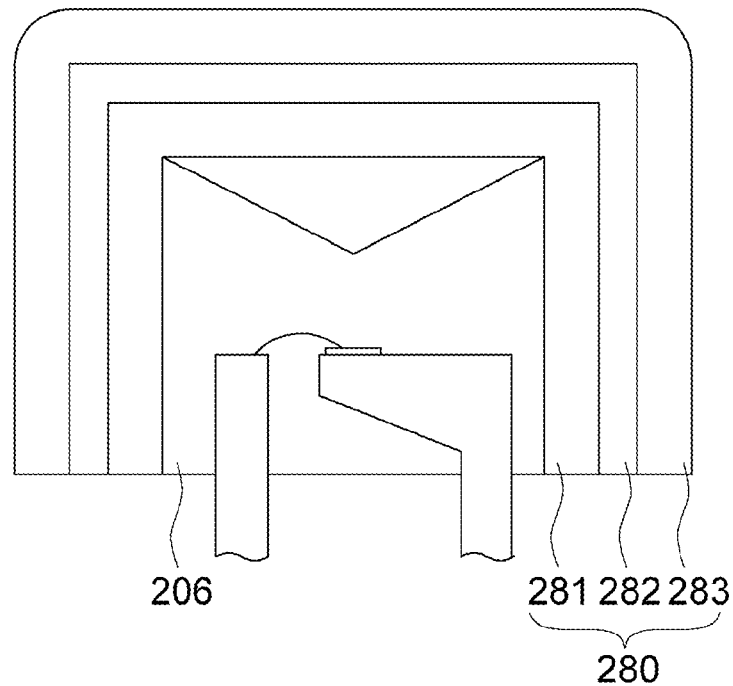
FIGS. 8C~8G show a fluorescent colloid layer having a multi-layered structure.
Figure 8D:
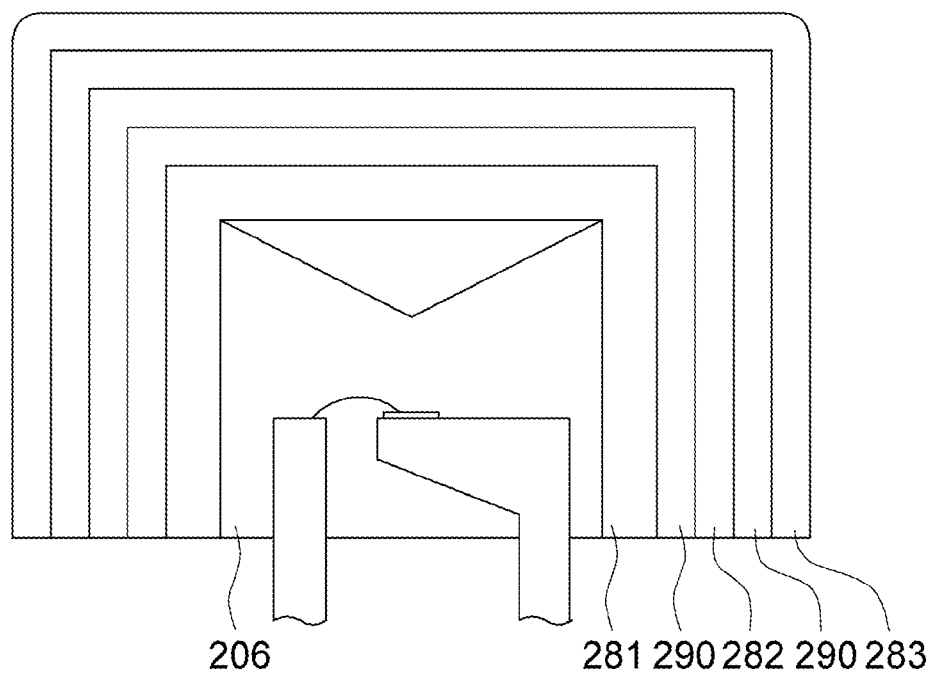
Figure 8E:
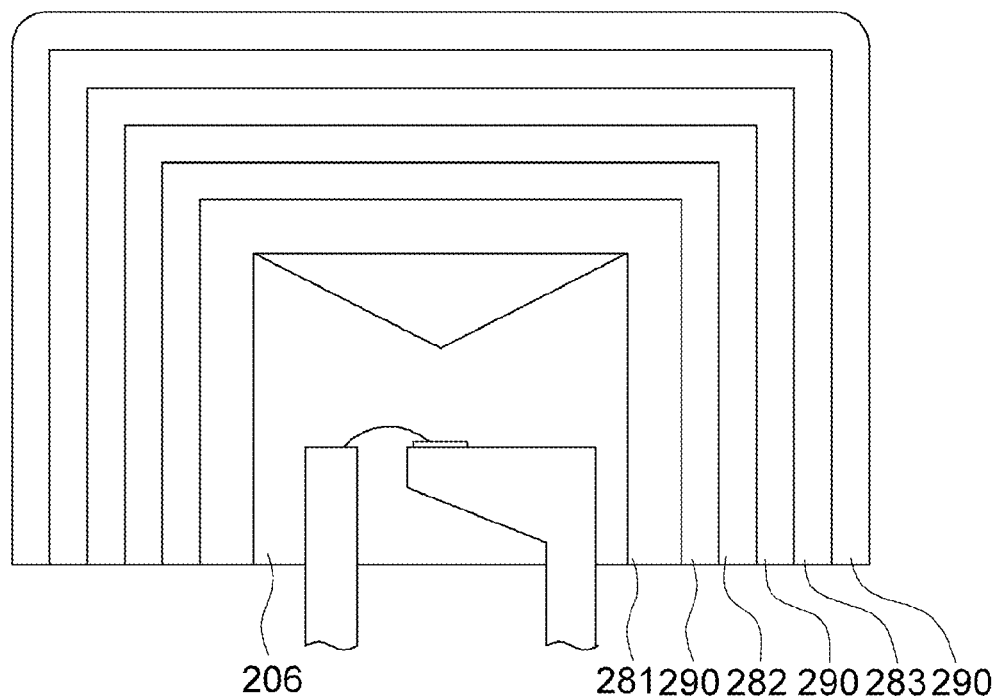

Other structural designs of the fluorescent colloid layer and the transparent encapsulant are disclosed below with accompanying drawings. Referring to FIGS. 8C~8G, diagrams of a fluorescent colloid layer having a multi-layered structure are shown. As shown in FIG. 8C, the fluorescent colloid layer 280 can be constituted by several fluorescent layers such as the first fluorescent layer 281, the second fluorescent layer 282 and the third fluorescent layer 283, wherein the second fluorescent layer 282 covers the first fluorescent layer 281, and the third fluorescent layer 283 covers the second fluorescent layer 282. Examples of the material of the fluorescent layer include red fluorescent powder, green fluorescent powder, blue fluorescent powder or fluorescent powder of other colors. As shown in FIG. 8D, several transparent spacer layers 290 are disposed among the first fluorescent layer 281, the second fluorescent layer 282 and the third fluorescent layer 283. As shown in FIG. 8E, a transparent spacer layer 290 is disposed outside the third fluorescent layer 283 to protect the third fluorescent layer 283.

Figure 8F:
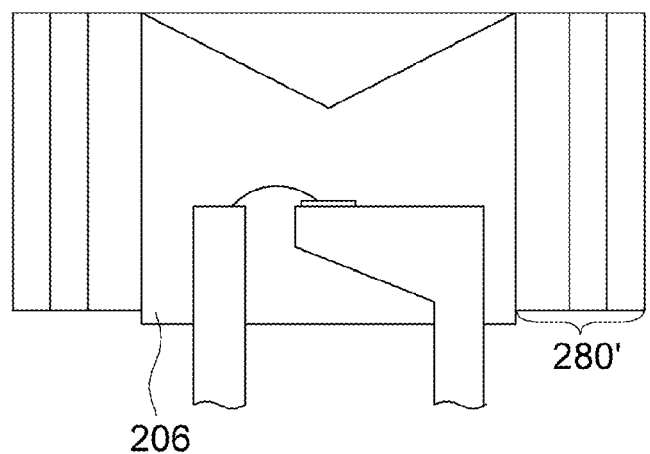
Figure 8G:
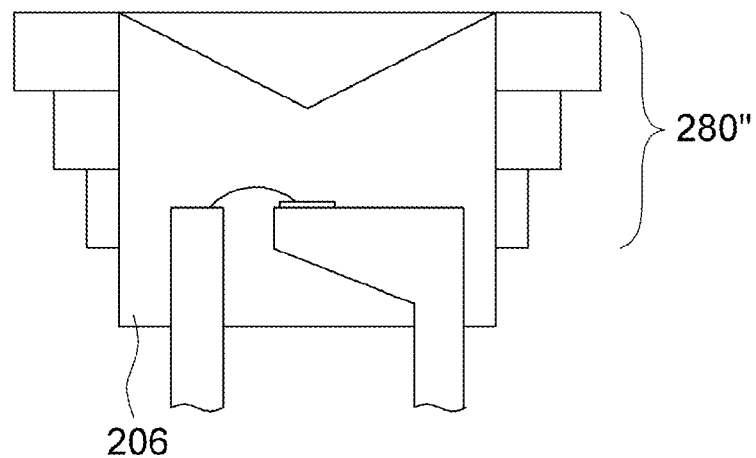
Figures 8H, 8I:
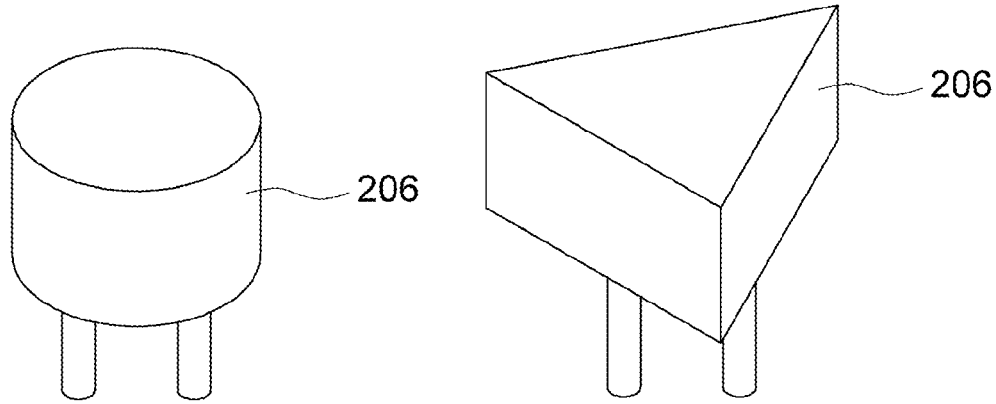
FIGS. 8H~8M show various appearances of the transparent encapsulant.
Figure 8J:
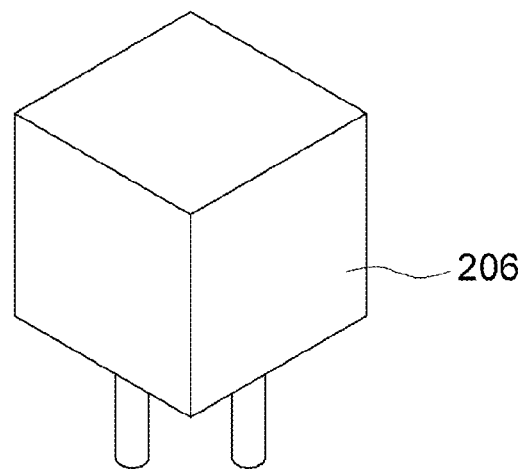
Figure 8K:
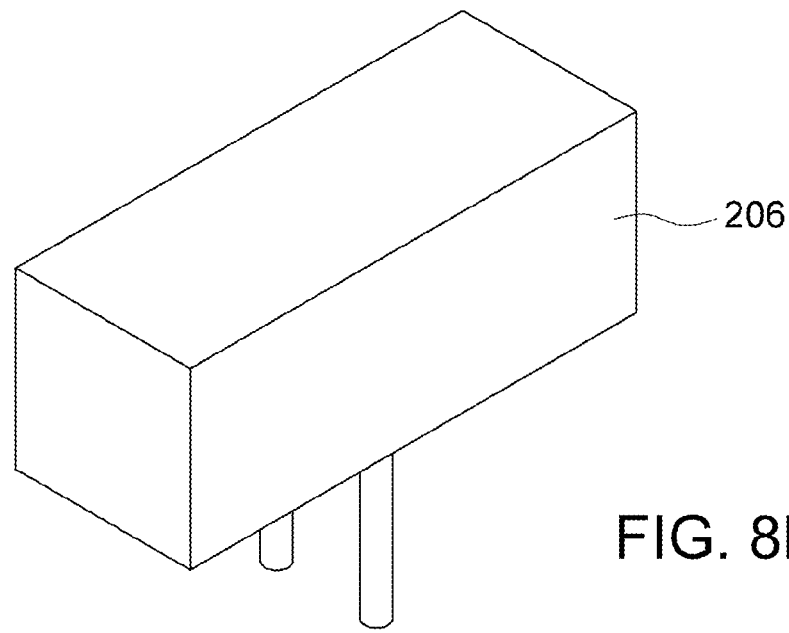
Figure 8L:
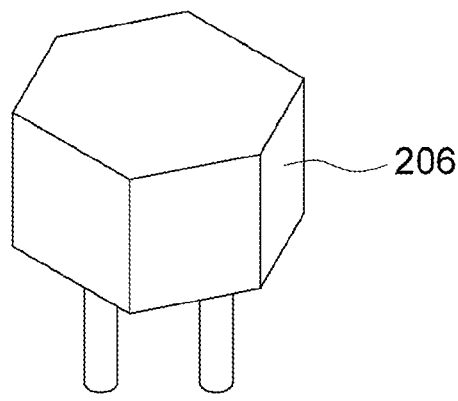
Figure 8M:
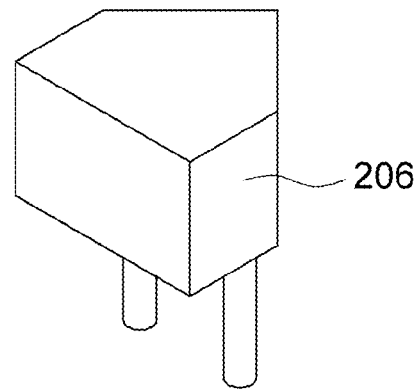

Moreover, as shown in FIG. 8F, the fluorescent colloid layer 280' can be merely disposed on sidewall of the transparent encapsulant 206. In addition to the stacking manner of the fluorescent layers 281, 282 and 283, as shown in FIG. 8G, different fluorescent layers of the fluorescent colloid layer 280' can also be sequentially disposed on one side of the transparent encapsulant 206 in a top down manner or in a bottom up manner, and different fluorescent layers can have the same or different thickness.

Referring to FIGS. 8H~8M, various appearances of the transparent encapsulant are shown. As shown in FIG. 8H~8M, the shape of the cross-section of the transparent encapsulant 206 can be a circle, an ellipse, a triangle, a square, a rectangle or a polygon.

Figure 8N:
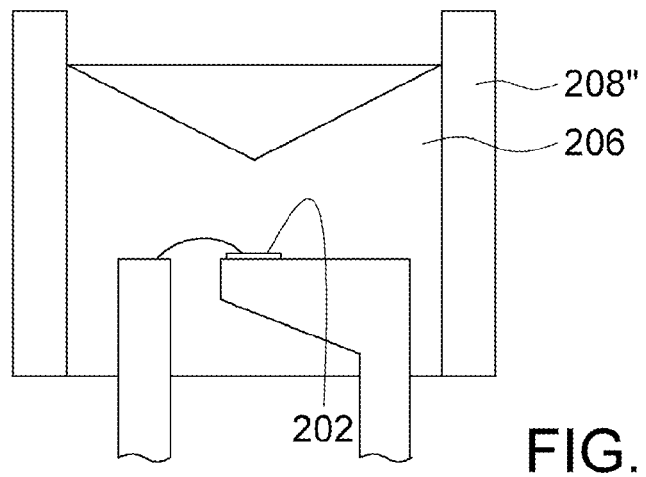
FIG. 8N shows a height of a fluorescent colloid layer being larger than that of a transparent encapsulant.
Figure 8O:
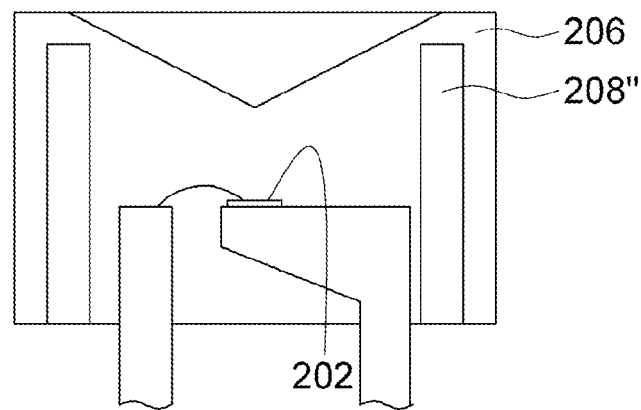
FIG. 8O shows a fluorescent colloid layer manufactured in the transparent encapsulant.
Figure 8P:
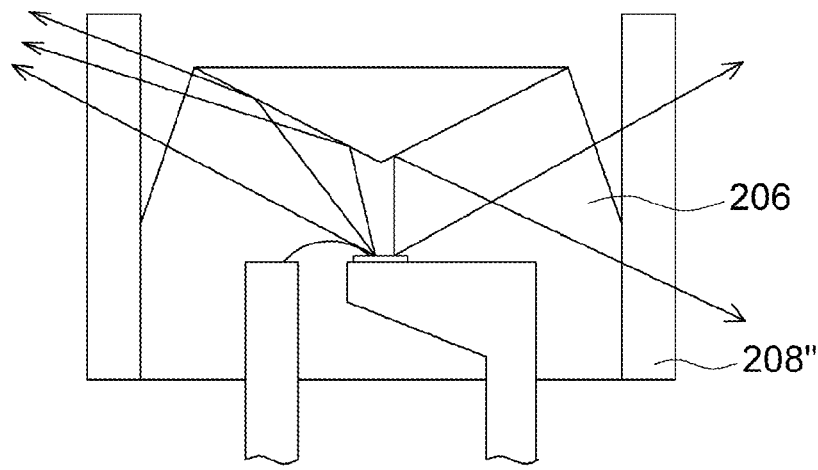
FIG. 8P shows a shape of the transparent encapsulant being changed and the height of the fluorescent colloid layer larger than that of the transparent encapsulant.

The fluorescent colloid layer and the transparent encapsulant can have other designs as shown in FIG. 8N-8P. As shown in FIG. 8N, the height of a fluorescent colloid layer 208" can be larger than that of a transparent encapsulant 206. As shown in FIG. 8O, a fluorescent colloid layer 208" can be manufactured in a transparent encapsulant 206. As shown in FIG. 8P, the shape at the upper part of a transparent encapsulant 206 can be changed, and the height of a fluorescent colloid layer 208" can be larger than that of a transparent encapsulant 206.

Let the light emitting diode (LED) be taken for example. As the naked eyes have higher perception of the white light and can recognize even slight color difference, the white light is often used as an initial standard in screening the LED products. Thus, the light filtering effect of the dye can be used to change a viewer's perception of the color temperature of white light source, such that the color of the light emitted by LED perceived by the viewer is consistent when the viewer views the white LED light source directly, and the original color temperature of the light source remains unaffected.

Figure 8Q:
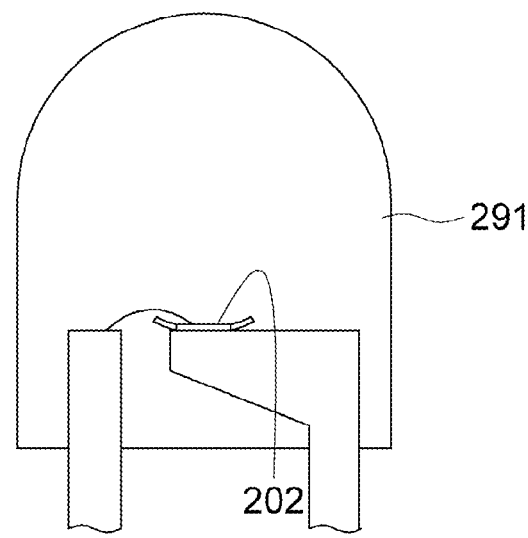
FIG. 8Q shows a dye colloid layer covering a light emitting unit.
Figure 8R:
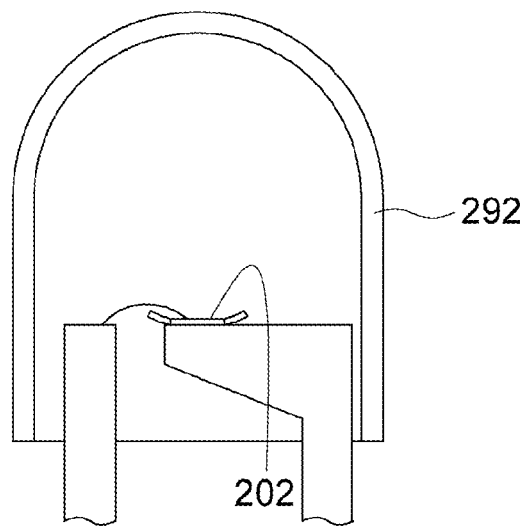
FIG. 8R shows a dye layer being the outmost layer.
Figure 8S:
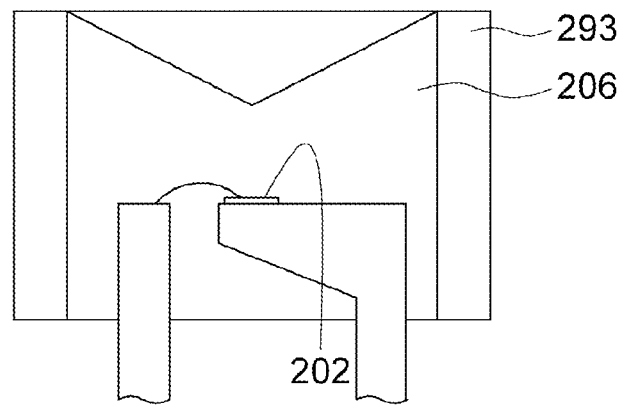
FIG. 8S shows a dye fluorescent layer being outside the transparent encapsulant.
Figure 8T:
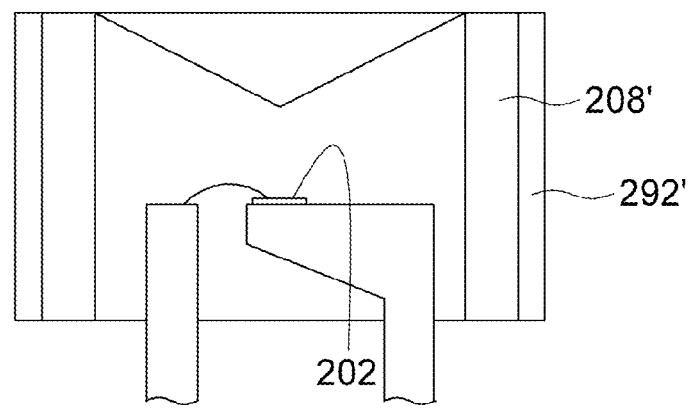
FIG. 8T shows a dye layer being outside the fluorescent colloid layer.
Figure 8U:
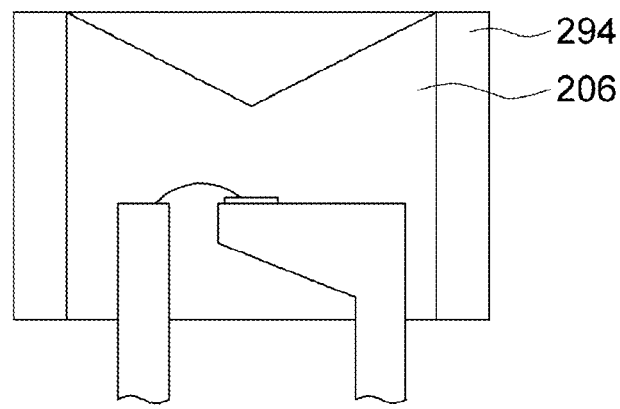
FIG. 8U shows a diffusion layer being outside the transparent encapsulant.

FIG. 8Q shows a dye colloid layer 291 covering a light emitting unit 202. The dye colloid layer 291 can be formed by a transparent glue and a dye, such that the light (white light) emitted by the light emitting unit 202 changes color through the light filtering effect of the dye colloid layer 291. As shown in FIG. 8R, a dye layer 292 is disposed as the outmost layer. FIG. 8S shows a dye fluorescent layer 293 being disposed outside the transparent encapsulant 206. The dye fluorescent layer 293 can be formed by a fluorescent powder and a dye. As shown in FIG. 8T, the dye layer 292' can be directly disposed outside the fluorescent colloid layer 208'. As shown in FIG. 8U, a diffusion layer 294 can also be disposed outside the transparent encapsulant 206. The diffusion layer 294 contains a diffusion agent for changing the light emitting directivity of LED and making the emitted light more uniformed.

Figure 8V:
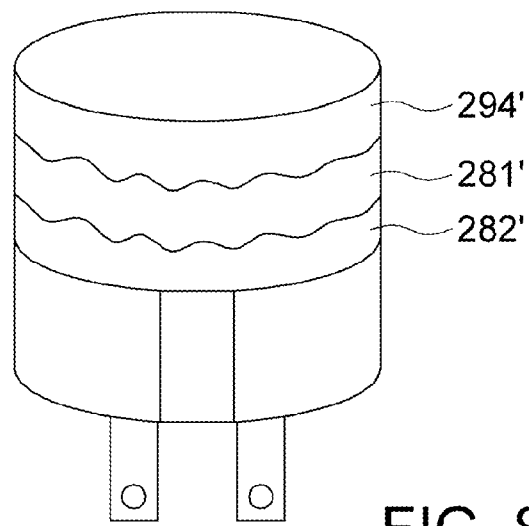
FIGS. 8V and 8W respectively show a light emitting device having a diffusion layer and a multi-layered fluorescent layer.

As shown in FIG. 8V, the diffusion layer 294', the first fluorescent layer 281' and the second fluorescent layer 282'can be concurrently disposed on the outmost layer. If the light emitting unit is a blue chip, then the diffusion layer 294' will emit the original blue light, the first fluorescent layer 281' can be made from yellow fluorescent powder, and the second fluorescent layer 282" can be made from green or red fluorescent powder.

Figure 8W:
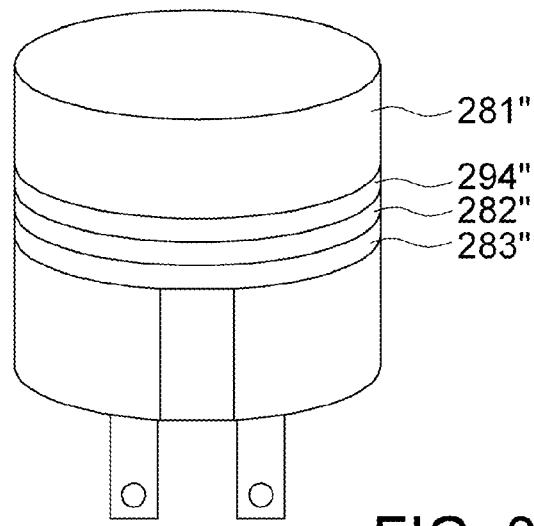

The design of FIG. 8W is different from that of FIG. 8V. As shown in FIG. 8W, on the outmost layer, the first fluorescent layer 281" (made from a yellow fluorescent powder) occupies the largest area, and the diffusion layer 294", the second fluorescent layer 282" and the third fluorescent layer 283" are sequentially disposed below. The second fluorescent layer 282" is made from green fluorescent powder for example, and the third fluorescent layer 283" is made from red fluorescent powder for example.

The color distribution of a multi-layered fluorescent layer can be regular or irregular, and the multi-layered fluorescent layer can be made by way of glue sealing, powder dusting, printing or spraying.

The LED can be viewed as a point light source. If the luminance of the light source is over-concentrated at a small point, the luminance of the light source will be too high to be viewed with naked eyes directly. As a result, the point light source cannot be effectively used in lighting products.

The light emitting device 200 of the embodiment guides the light of the light emitting unit 202 to the side wall 208A of the fluorescent colloid layer 208 and forms side light. A part of the side light is converted to fluorescent light by the fluorescent colloid layer 208 and re-mixed with the original side light, hence having a larger light-emitting area and effectively reducing the luminance of the point light source of the light emitting unit 202. Thus, the problems of dazzle and eye-offending caused by high luminance of the point light source are resolved. As the transparent encapsulant 206 separates the fluorescent colloid layer 208 from the light emitting unit 202, the fluorescent colloid layer 208 does not contact the light emitting unit 202 directly, hence avoiding the fluorescent colloid layer 208 being aged due to high temperature generated by the light emitting unit 202, and effectively increasing the lifespan of the light emitting device 200.

The design of the leadframe 204 of the light emitting device 200 of the present embodiment of the disclosure is not limited to the structure as illustrated in FIG. 4A, the leadframe 204 can have the structure of the leadframe 104 of FIG. 1A to facilitate the assembly and heat dissipation of the light emitting device 200. In a preferred embodiment, when the leadframe 204 is replaced by the leadframe 104, the area of the leadframe 104 can be suitably enlarged to avoid the light generated from the light emitting unit 202 being leaked from underneath, such that the lighting efficiency of the light emitting device 200 is increased.

Figure 13A:
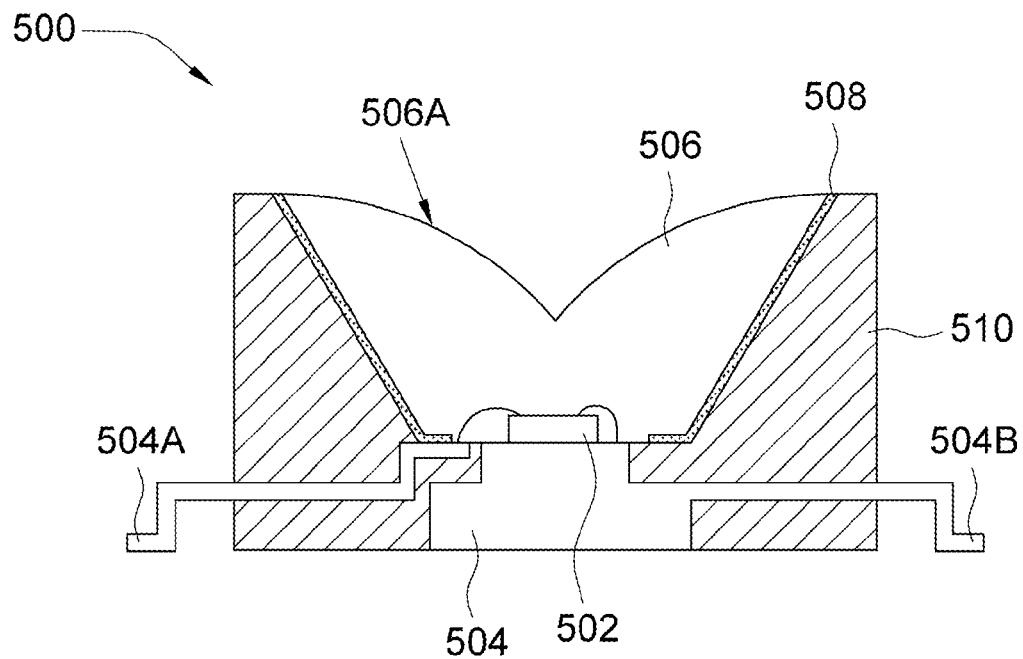
FIG. 13A shows another light emitting device according to a preferred embodiment of the disclosure.

Referring to FIG. 13A, another light emitting device according to a preferred embodiment of the disclosure is shown. The light emitting device 500 includes a light emitting unit 502, a leadframe 504, a transparent encapsulant 506, a fluorescent colloid layer 508 and a non-transparent side element 510. The light emitting unit 502 is disposed on the leadframe 504 for electrically connecting two conductive branches 504A and 504B of the leadframe 504. The non-transparent side element 510 surrounds the light emitting unit 502. The transparent encapsulant 506 covers the light emitting unit 502 and is located inside the non-transparent side element 510. The fluorescent colloid layer 508 is disposed at the side wall of the transparent encapsulant 506 and located between the non-transparent side element 510 and the transparent encapsulant 506. The non-transparent side element 510 is made from materials such as plastics or ceramics.

The transparent encapsulant 506 is preferably made from a material with high refractive index. For example, as the air has a refractive index of 1, and the transparent encapsulant 506 has a refractive index of 1.5, the concaved top surface can be a total reflective surface 506A. The light generated by the light emitting unit 502 will be totally reflected by the total reflective surface 506A and guided to the side wall of the transparent encapsulant 506 to excite the fluorescent colloid layer 508 and generate a mixed light. As there is a non-transparent side element 510 surrounding the fluorescent colloid layer 508, the mixed light will be guided to be outputted from the top of the transparent encapsulant 506 by the non-transparent side element 510. Besides, the light not exciting the fluorescent colloid layer 508 will again pass through the fluorescent colloid layer 508 and increase the intensity of the mixed light.

Let the making of white light effect be taken for example. A blue LED chip is used as a light emitting unit 502, and a fluorescent colloid layer 508 made from yellow fluorescent powder is used. When the blue light generated by the blue LED chip is guided to the fluorescent colloid layer 508, the blue light will first excite the yellow fluorescent powder to generate a yellow light, and a white light is generated when the yellow light is mixed with the blue light. The white light will be reflected by the non-transparent side element 510 and outputted from the top of the transparent encapsulant 506. As there is not any closed area at the top of the transparent encapsulant 506, the efficiency of light emitting is effectively increased.

Figure 13B:
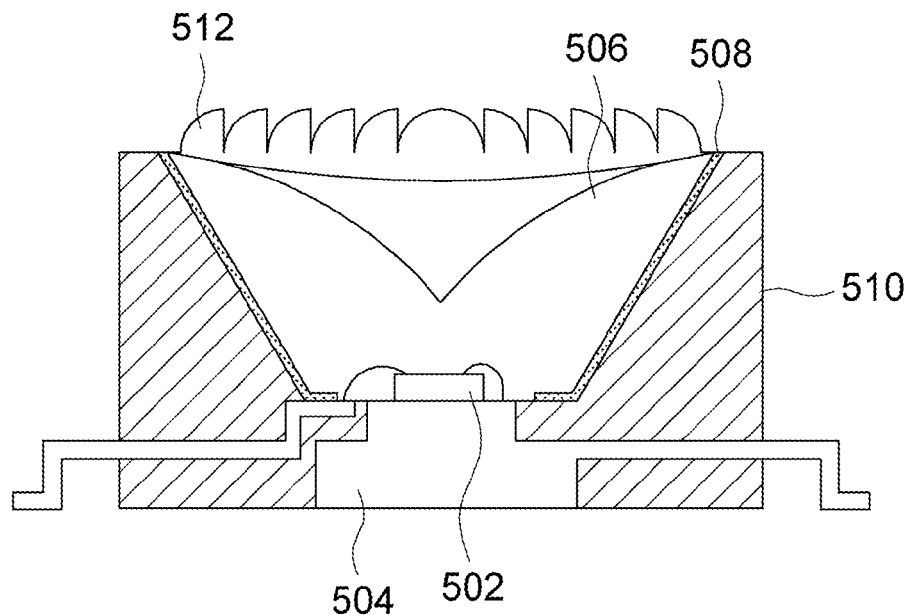
FIGS. 13B and 13C show the light emitting device of FIG. 13A disposed with a front light-collecting lens.
Figure 13C:
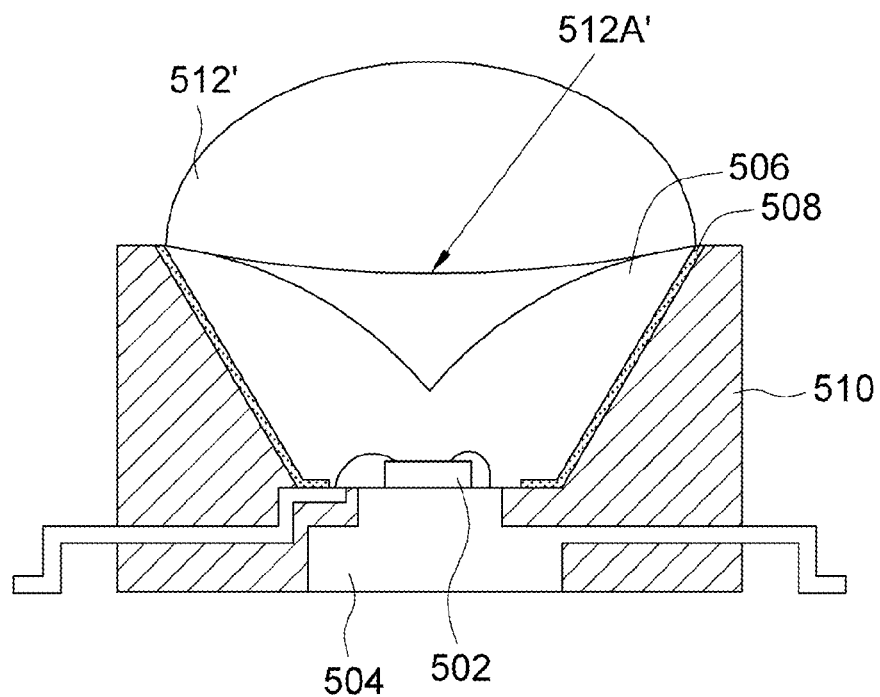

Referring to FIGS. 13B and 13C, the light emitting device of FIG. 13A disposed with a front light-collecting lens is shown. As indicated in FIG. 13B, the front light-collecting lens 512 is disposed at the top of the transparent encapsulant 506 for controlling light-emitting direction. The front light-collecting lens 512 can be made from an optical lens whose cross section can be many interconnected quarter circles. As indicated in FIG. 13C, the front light-collecting lens 512' can also be a convex lens, and the light outputted from the top of the transparent encapsulant 506 will pass through the light-collecting interface 512A' of the front light-collecting lens 512' and the front light-collecting lens 512', so that the angle of the light can be adjusted.

Figure 13D:
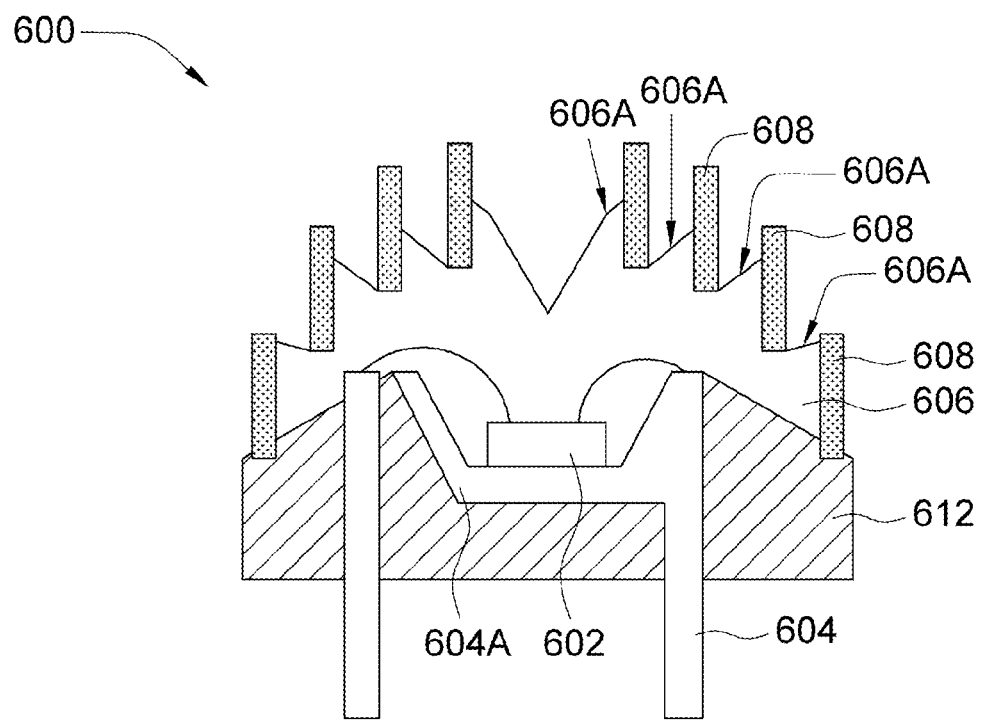
FIGS. 13D and 13E show many fluorescent colloid layers erected on the light emitting device.
Figure 13E:
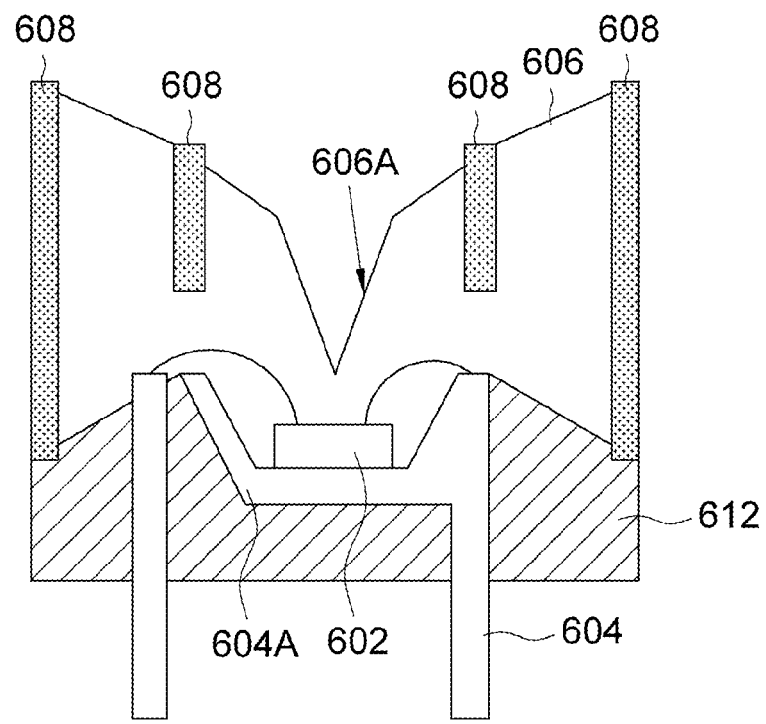

Referring to FIGS. 13D and 13E, many fluorescent colloid layers erected in the light emitting device are shown. As indicated in FIG. 13D, the light emitting device 600 includes a light emitting unit 602, a leadframe 604, a transparent encapsulant 606, many fluorescent colloid layers 608 and a non-transparent carrier 612. The light emitting unit 602 is disposed on the leadframe 604, and preferably, on a reflective cup 604A of the leadframe 604. The reflective cup 604A is for guiding the light upwards to avoid the light directly emitting from the sides or the bottom of the transparent encapsulant 606. The transparent encapsulant 606 has many discontinuous reflective surfaces 606A. Each fluorescent colloid layer 608 is vertically disposed at one side of a reflective surface 606A. Thus, when the light of the light emitting unit 602 is guided to the adjacent fluorescent colloid layer 608 from different position of the reflective surfaces 606A of the transparent encapsulant 606, the light will directly excite the fluorescent colloid layer 608.

As indicated in FIG. 13E, a part of the fluorescent colloid layer 608 can also be embedded into the transparent encapsulant 606. The transparent encapsulant 606 has many rings of fluorescent colloid layers 608, wherein the fluorescent colloid layers 608 in the inner rings are embedded into the transparent encapsulant 606. After the light emitted from the light emitting unit 602 is reflected from the reflective surface 606A, a part of the light will be directed to the fluorescent colloid layers 608 in the outer rings and excite the fluorescent colloid layers 608 in the outer rings. Meanwhile, a part of the light will be emitted to the fluorescent colloid layers 608 in the inner rings first, and then transmitted to the fluorescent colloid layers 608 in the outer rings. A non-transparent reflective layer can also be disposed on the total reflective surface 606A of FIGS. 13D and 13E. The wavelengths of excitation of the fluorescent colloid layers 608 can be the same or different.

Figure 13F:
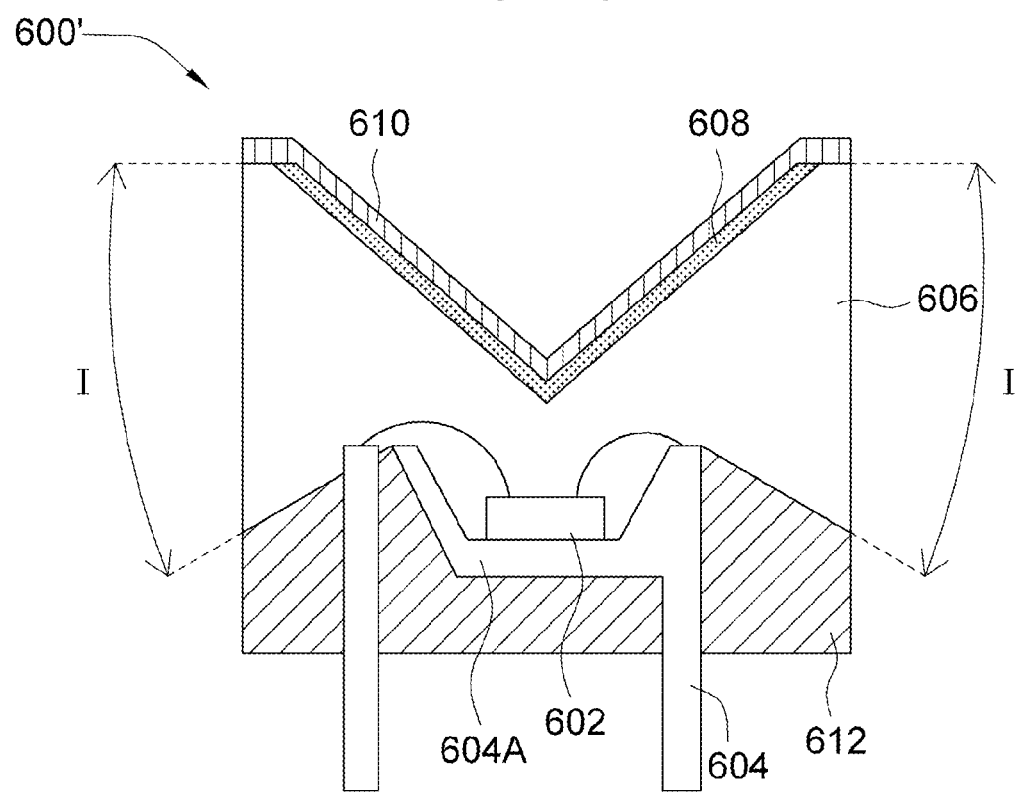
FIG. 13F shows a light emitting device capable of controlling light-emitting range.

Referring to FIG. 13F, a light emitting device capable of controlling light-emitting range is shown. The light emitting device 600' includes a light emitting unit 602, a leadframe 604, a transparent encapsulant 606, a fluorescent colloid layer 608 and a non-transparent reflective layer 610. The light emitting unit 602 is disposed on the leadframe 604, and preferably, on a reflective cup 604A of the leadframe 604. The reflective cup 604A is for guiding the light upwards to avoid the light directly outputting from the sides or the bottom of the transparent encapsulant 606. The light emitting device 600 can further include a non-transparent carrier 612 disposed at the bottom side of the leadframe 604. The transparent encapsulant 606 covers the light emitting unit 602. The top surface of the transparent encapsulant 606 is concave. The fluorescent colloid layer 608 is disposed on the top surface of the transparent encapsulant 606. The non-transparent reflective layer 610 covers the fluorescent colloid layer 608. The non-transparent reflective layer 610 can be made from metal or plastics.

The light generated by the light emitting unit 602 is collected and centralized by the reflective cup 604A and then is guided upwardly onto the fluorescent colloid layer 608 to excite the color lights of other wavelengths, which are re-mixed with the color lights originally generated by the light emitting unit 602 to generate a white light for example. Then, the mixed light is reflected by the non-transparent reflective layer 610 and outputted from the side wall of the transparent encapsulant 606. As the bottom layer is the non-transparent carrier 612, the light-emitting angle of the mixed light is restricted and the mixed light can only be emitted from the region I.

Figure 13G:
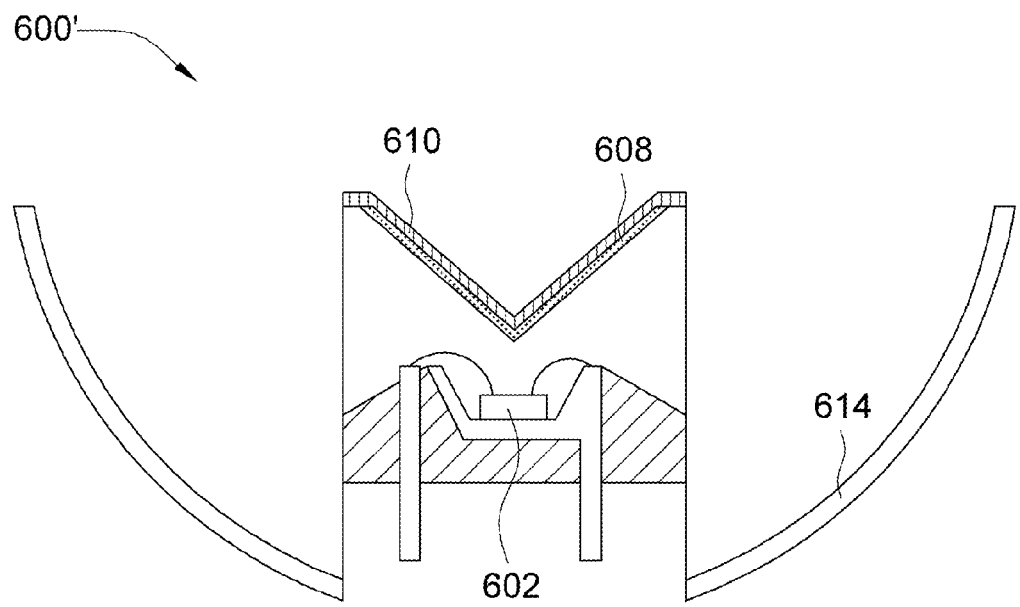
FIG. 13G shows a light emitting device of FIG. 13F disposed with a secondary optical reflective layer.

Also, referring to FIG. 13G, a light emitting device of FIG. 13F disposed with a secondary optical reflective layer is shown. The secondary optical reflective layer is provided by a cup-shaped reflector 614 for example. The cup-shaped reflector 614 is disposed at the peripheral of the bottom side of the light emitting device 600'. Conventionally, the front light area (corresponding to the non-transparent reflective layer 610 for example) of a spot light (such as a vehicle lamp) does not have a non-transparent reflective layer 610, so that the light is very concentrated and the problem of dazzling light may occur easily. The light emitting device 600' of the present embodiment of the disclosure has the non-transparent reflective layer 610 for blocking the front light output of the light emitting unit 602, so the light outputted from the light emitting unit 602 changes to lateral light output from front light output. With the disposition of the cup-shaped reflector 614, lateral light output is changed back to front light output (the upward direction as indicated in the diagram). As the light emitting device 600' does not have a front light area, the problem of dazzling light is resolved. Thus, the light emitting device 600' is ideal for spotlight. Moreover, with the disposition of the secondary optical reflective layer, the original light-outputting surface is increased, the distribution of light is more easily adjusted, and the over luminance is effectively reduced.

Figure 13H:
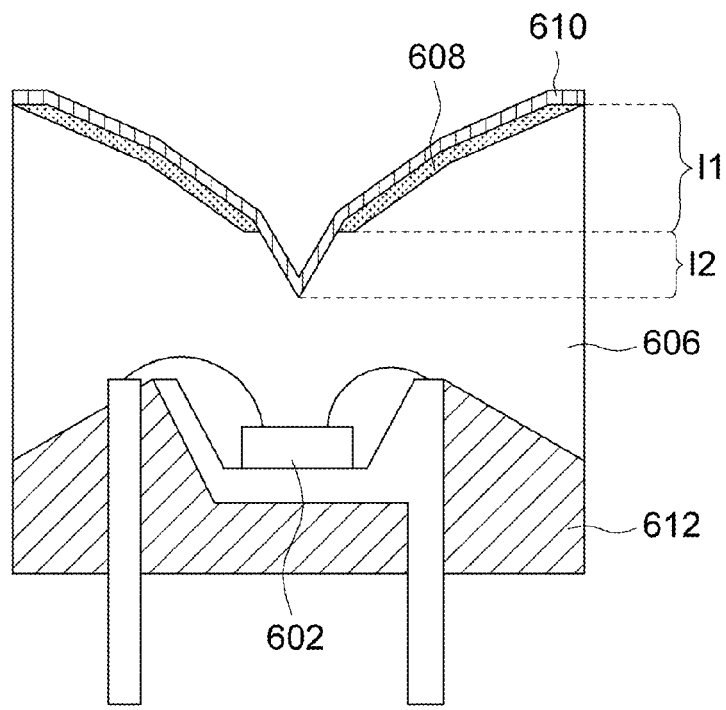
FIGS. 13H~13K show other dispositions of the fluorescent colloid layer and the non-transparent reflective layer of FIG. 13F.

Referring to FIGS. 13H~13K, other dispositions of the fluorescent colloid layer and the non-transparent reflective layer of FIG. 13F are shown. As indicated in FIG. 13H, the top surface of the transparent encapsulant 606 can be divided into several segments, wherein the fluorescent colloid layer 608 is only disposed on a few segments such as the segment corresponding to the region 11 for example, and the segment corresponding to the region 12 does not have any fluorescent powder. Thus, when a part of the light of the light emitting unit 602 is emitted from the region 12, the color of the region 12 is the original color of the light emitting unit 602. As for the region 11, the light of the light emitting unit 602 will excite the fluorescent colloid layer 608, and the excited color light will be reflected by the non-transparent reflective layer 610 and make the region 11 present the color of the color light.

Figure 13I:
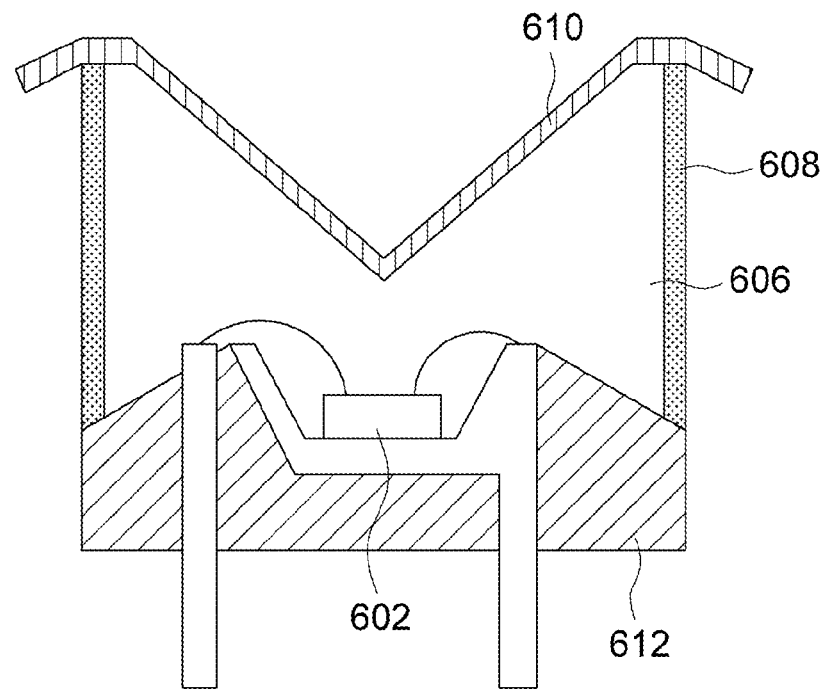

As indicated in FIG. 13I, the fluorescent colloid layer 608 is disposed at the side wall of the transparent encapsulant 606. The non-transparent reflective layer 610 not only covers the transparent encapsulant 606 but is further extended outward for blocking the light outputted from the top edge of the transparent encapsulant 606, hence avoiding the light being centralized right upon the light emitting unit 602. That is, the light generated by the light emitting unit 602 will be reflected by the non-transparent reflective layer 610 and guided to the side wall of the transparent encapsulant 606 so as to excite the fluorescent colloid layer 608.

Figure 13J:
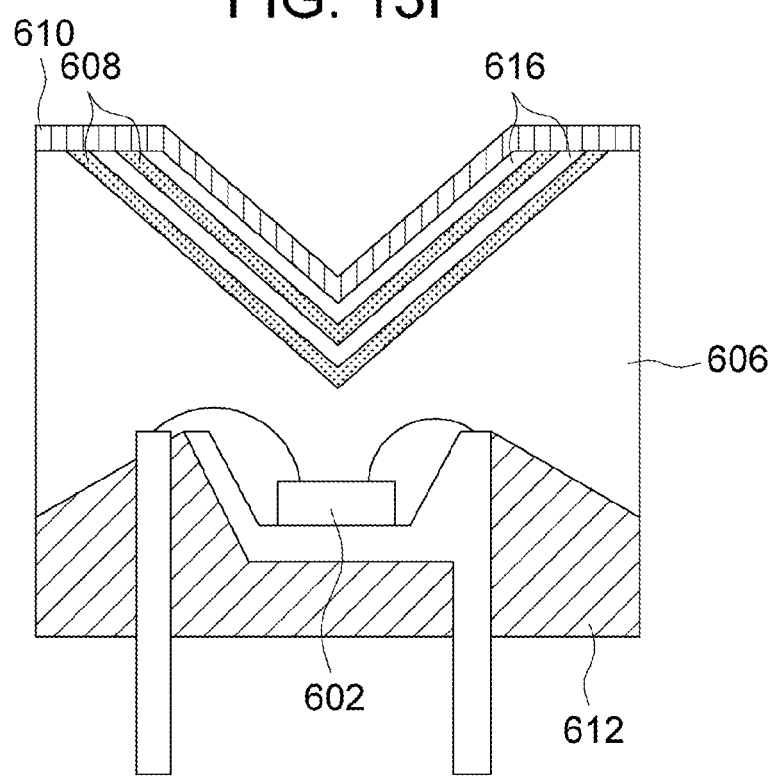

As indicated in FIG. 13J, many fluorescent colloid layers 608 are disposed on the transparent encapsulant 606 at the same time, and a transparent spacer layer 616 is disposed between two fluorescent colloid layers 608. The multi-layered structure of the fluorescent colloid layer 608 and the transparent spacer layer 616 alternately stacked together increases the diffusion of the light. Also, the wavelengths of excitation light of the fluorescent colloid layers 608 can be the same or different.

Figure 13K:
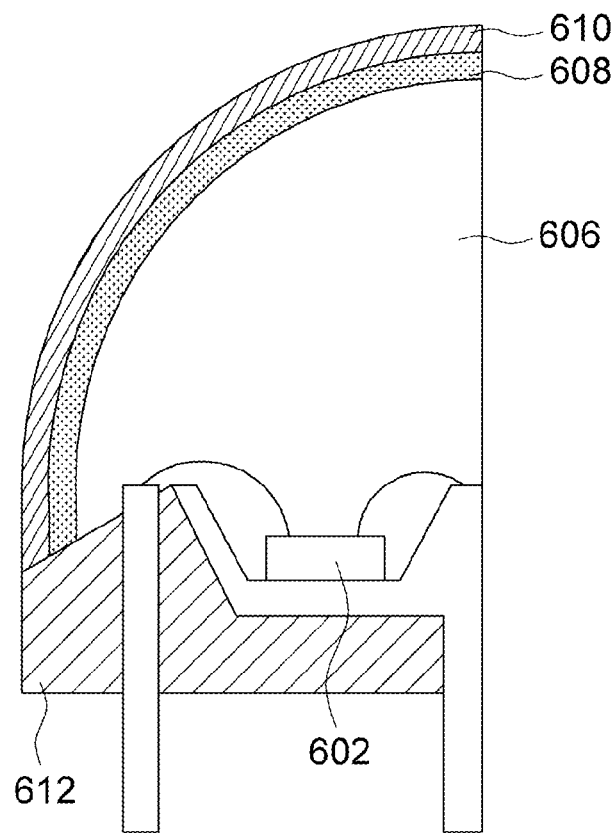

As indicated in FIG. 13K, the reflective surface of the transparent encapsulant 606 can have a curvature. For example, the transparent encapsulant 606 is a quarter spheroid, and the fluorescent colloid layer 608 is disposed along the outer surface of the spheroid of the transparent encapsulant 606, and the non-transparent reflective layer 610 covers the fluorescent colloid layer 608. The mixed light generated from the light of the light emitting unit 602 and the color light of the fluorescent colloid layer 608 will be reflected by the non-transparent reflective layer 610 and outputted from one side (such as the vertical side indicated at the right side of the diagram) of the transparent encapsulant 606.

Figure 13L:
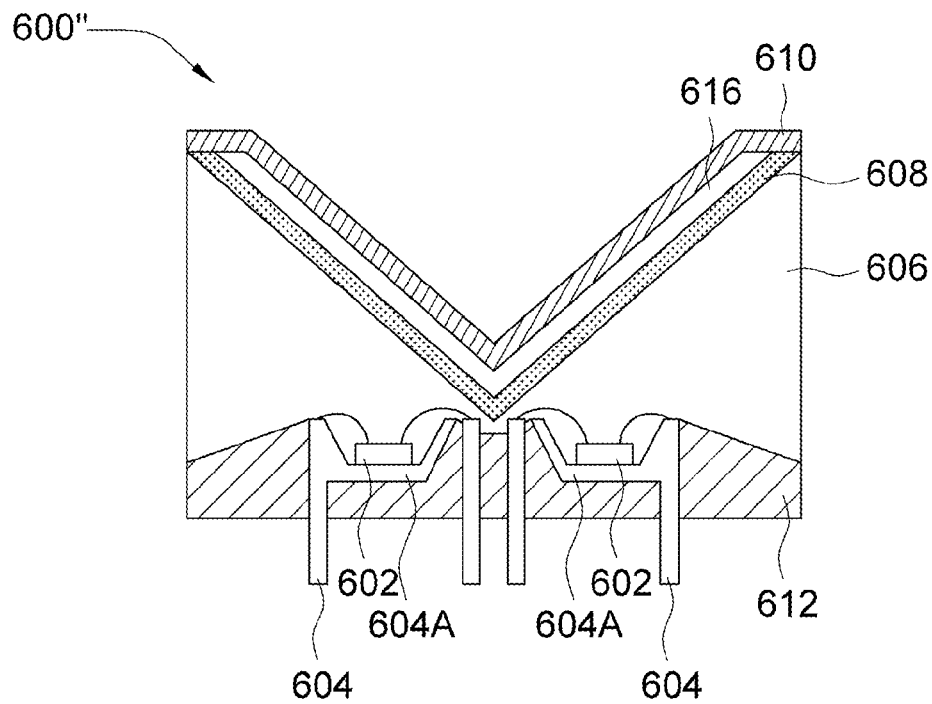
FIG. 13L shows the light emitting device having many light emitting units.

Referring to FIG. 13L, a light emitting device having many light emitting units is shown. As the light emitting device has many light emitting units, the total watts of the output power of the light source is increased. As indicated in FIG. 13L, the light emitting device 600'' has two light emitting units 602 each being disposed in the reflective cup 604A of a leadframe 604. The transparent encapsulant 606 has a concaved top surface, and the two light emitting units 602 are preferably disposed at two sides of the lowest point of the top surface of the transparent encapsulant 606. The top surface of the transparent encapsulant 606 sequentially has a fluorescent colloid layer 608, a transparent spacer layer 616 and a non-transparent reflective layer 610. After the light emitted by the light emitting unit 602 passes through the fluorescent colloid layer 608, the light will be reflected to the fluorescent colloid layer 608 from the non-transparent reflective layer 610. That is, the fluorescent powder of the fluorescent colloid layer 608 will function twice, and the mixed light is more uniformly generated. Also, with the disposition of the transparent spacer layer 616, the mixed light region is increased, and the uniform distribution of the light is enhanced.

The stacked light emitting device of the present embodiment of the disclosure includes a main leadframe, at least one dissipating leadframe and at least one light emitting unit. The dissipating leadframe is disposed on a side of the main leadframe. The light emitting unit is disposed on the dissipating leadframe and is electrically connected to a pair of electrode pins on the main leadframe. As the main leadframe and the dissipating leadframe carrying the light emitting unit are stacked together, each element can be independently processed and then assembled together. Thus, the processing precision of the structure is increased and the elements are electro-thermally isolated. The present embodiment is exemplified below.

Figure 9A:
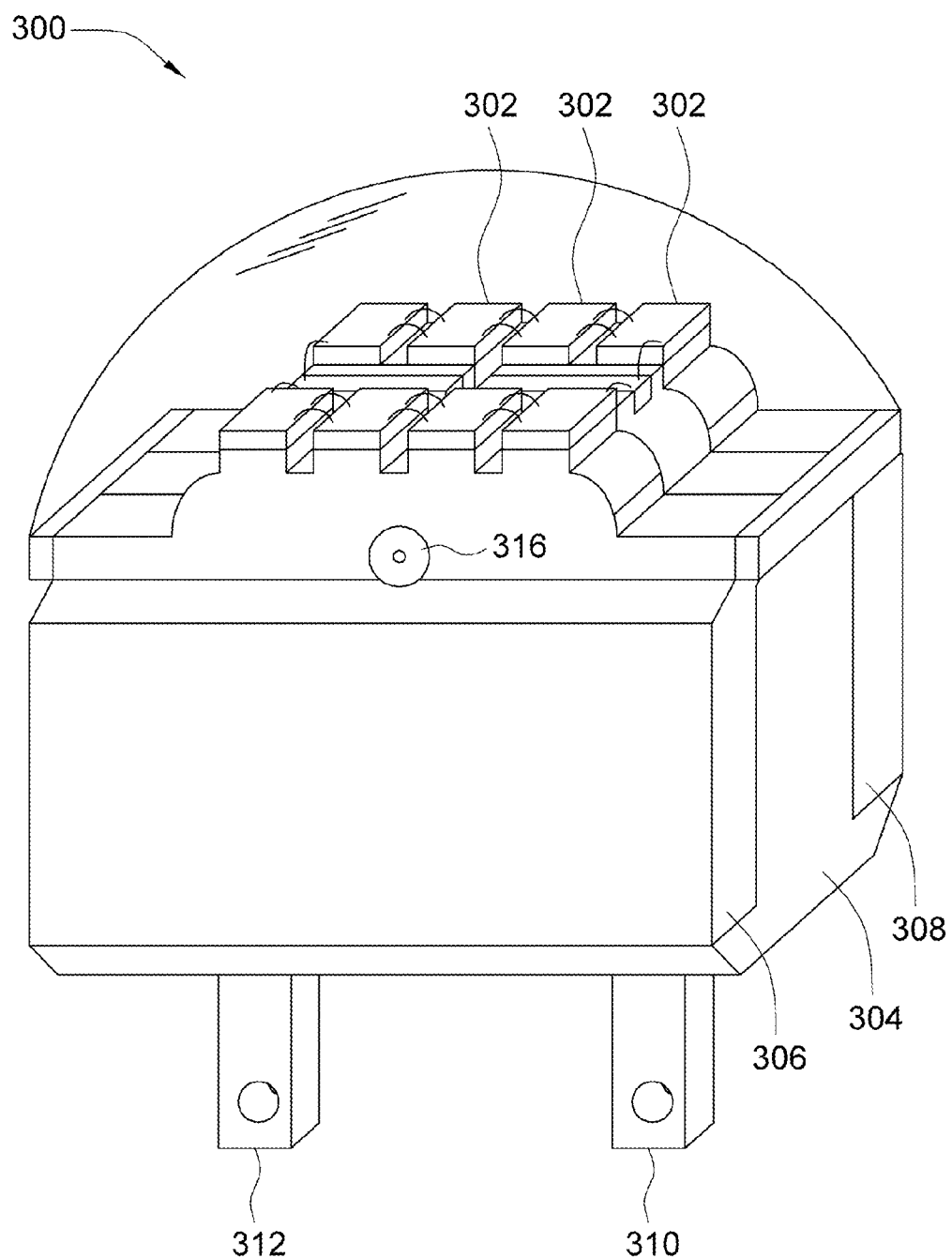
FIG. 9A shows a stacked light emitting device according to a preferred embodiment of the disclosure.
Figure 9B:
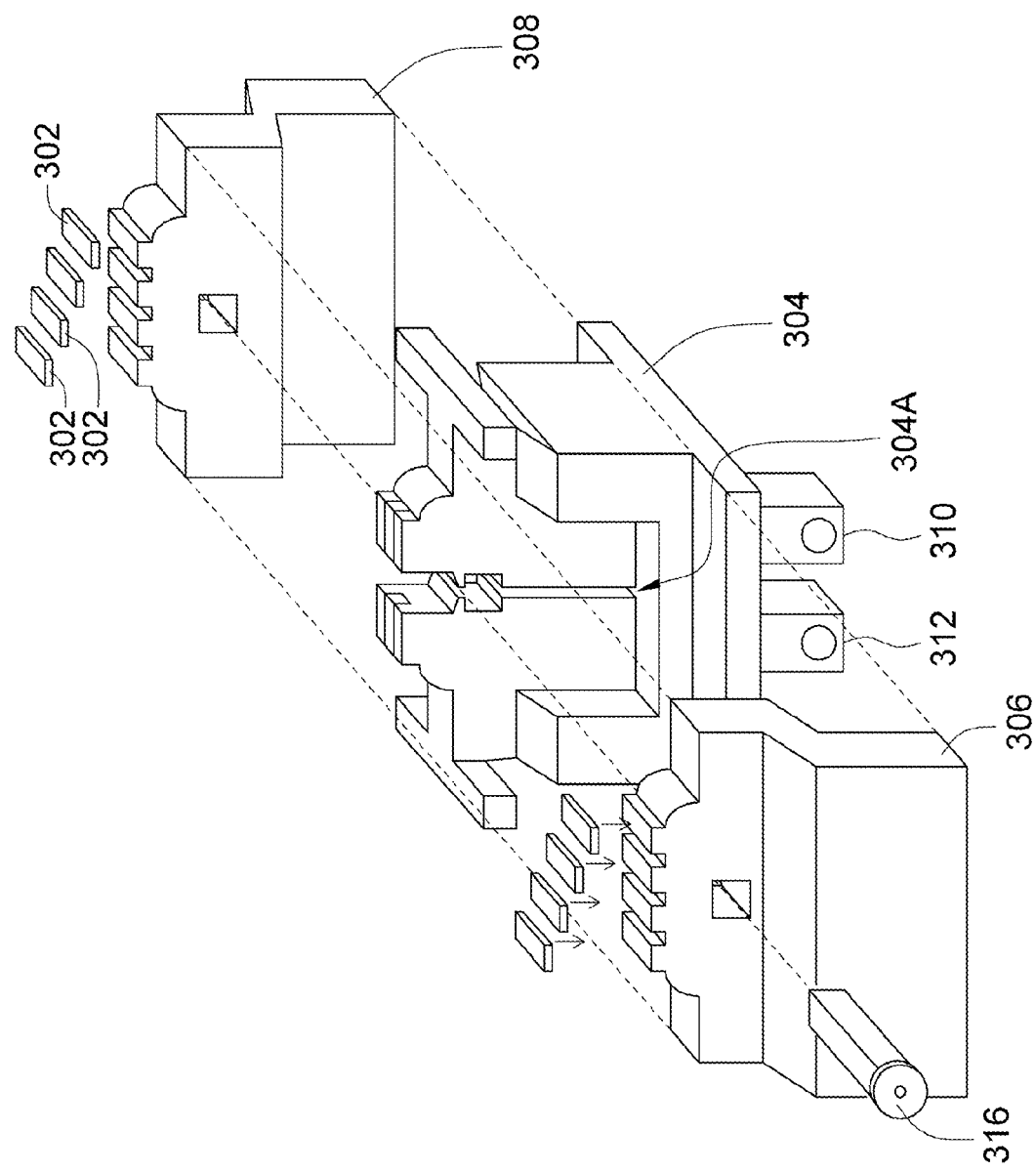
FIG. 9B shows an exploded diagram of the stacked light emitting device of FIG. 9A.

FIG. 9A shows a stacked light emitting device according to a preferred embodiment of the disclosure. FIG. 9B shows an exploded diagram of the stacked light emitting device of FIG. 9A. The stacked light emitting device 300 includes several light emitting units 302, a main leadframe 304, and two dissipating leadframes 306 and 308. A pair of electrode pins 310 and 312 is disposed on the main leadframe 304. The dissipating leadframes 306 and 308 are respectively disposed at two opposite sides of the main leadframe 304. The light emitting units 302 are divided into two groups respectively disposed on the dissipating leadframes 306 and 308 and electrically connected to the electrode pins 310 and 312. The light emitting units 302 are arranged on the dissipating leadframes 306 and 308 in rows, and each light emitting unit 302 on the dissipating leadframe 306 corresponds to another light emitting unit 302 on the dissipating leadframe 308.

The material of the main leadframe 304 can be insulating and non-conductive. The main leadframe 304 is used for fixing the two dissipating leadframes 306 and 308 as well as insulating the two electrode pins 310 and 312 from other elements. As shown in FIG. 9B, the dissipating leadframes 306 and 308 are two pieces for leaning against two sides of the main leadframe 304 and help the light emitting unit 302 to dissipate heat. The two electrode pins 310 and 312 are extended outward from the bottom surface of the main leadframe 304, and make the stacked light emitting device 300 ready to be plugged into. In addition, an exhausting slot 304A is disposed on the main leadframe 304. The exhausting slot 304A is extended towards the inside of the main leadframe 304 from a position near the electrode pins 310 and 312 for discharging unnecessary gas generated during the manufacturing process.

The dissipating leadframes 306 and 308 are respectively disposed on the main leadframe 304 from the two sides of the main leadframe 304, wherein the dissipating leadframes 306 and 308 and the main leadframe 304 are combined by at least one fixing element 316. The fixing element 316 can be any fastening member such as a rivet or a screw. The main leadframe 304 can be made from a polymeric material such as plastics or rubber. And, the dissipating leadframes 306 and 308 and the main leadframe 304 can be combined by hot stamping.

Figure 9C:
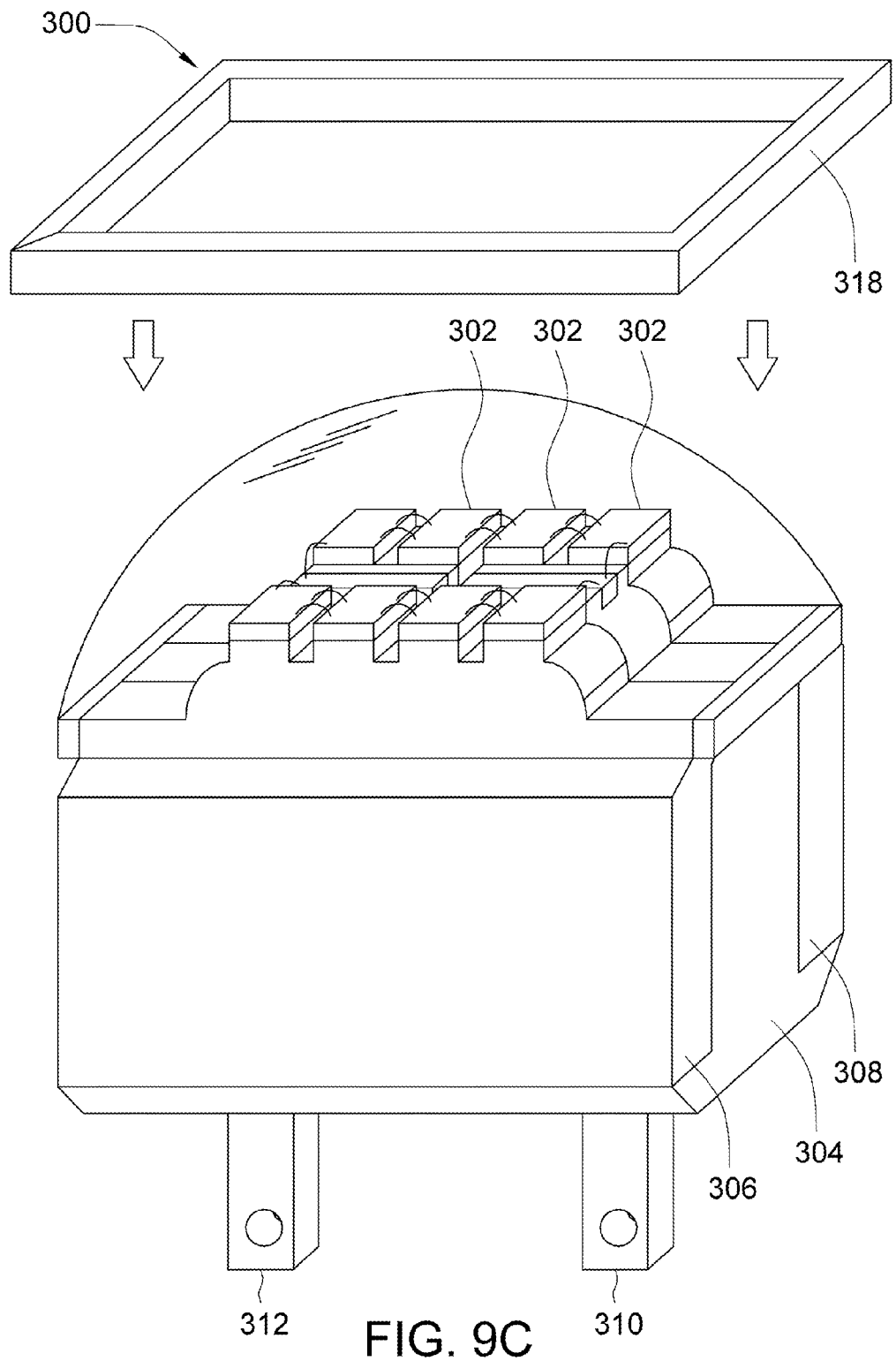
FIGS. 9C and 9D show the stacked light emitting device being fixed with a frame.
Figure 9D:
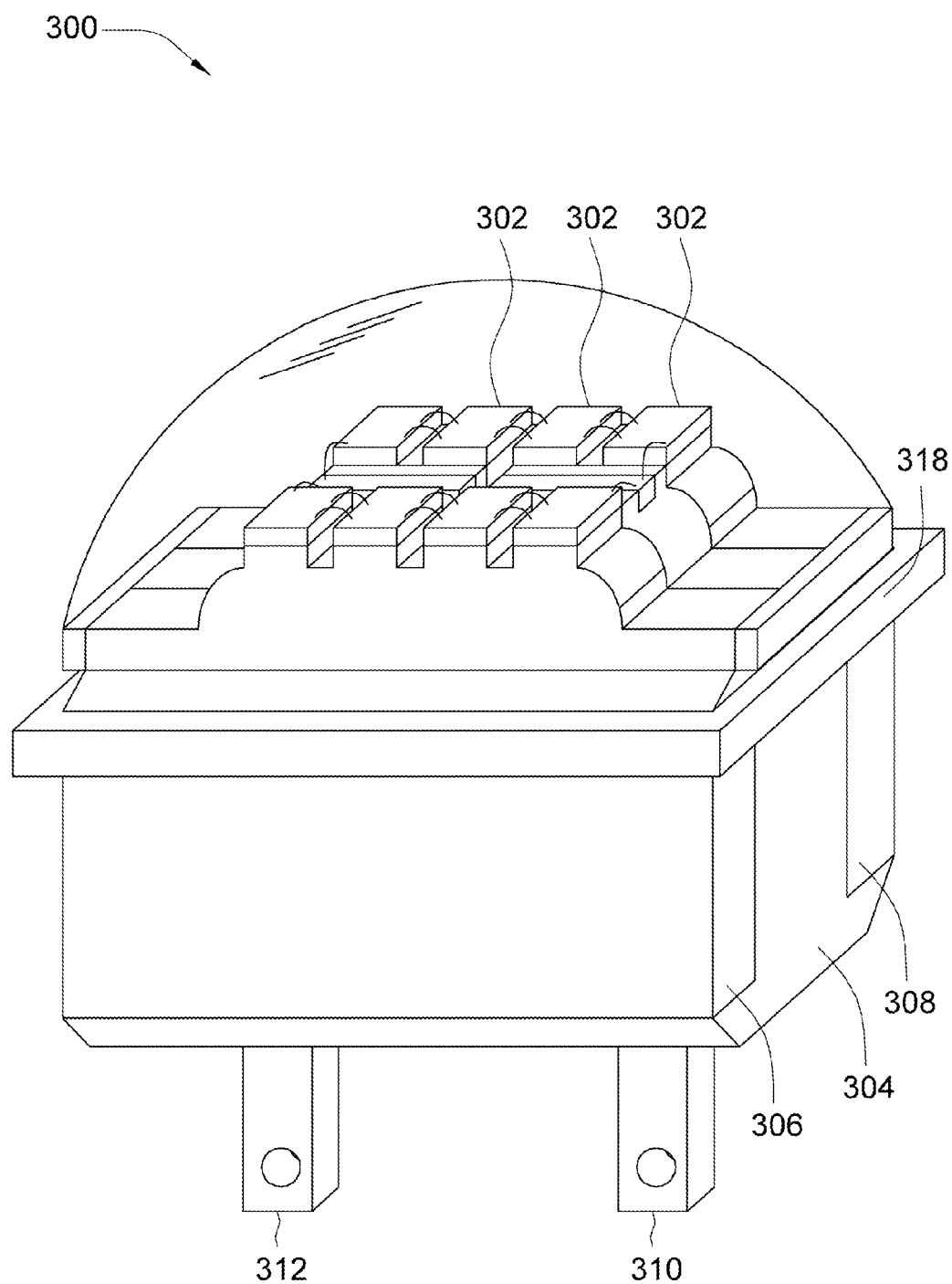
Figure 9E:
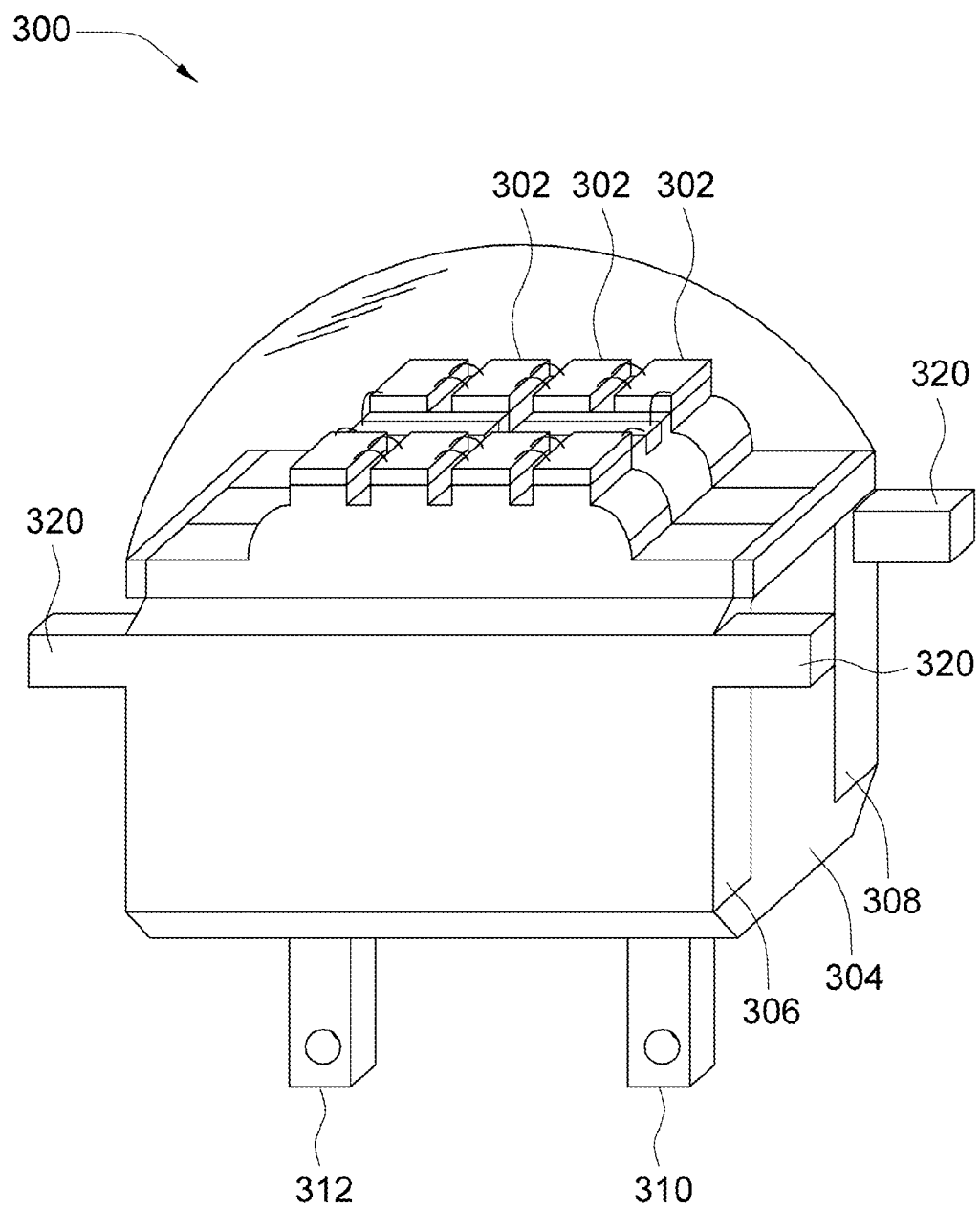
FIGS. 9E and 9F show the stacked light emitting device being fixed with extension pieces.
Figure 9F:
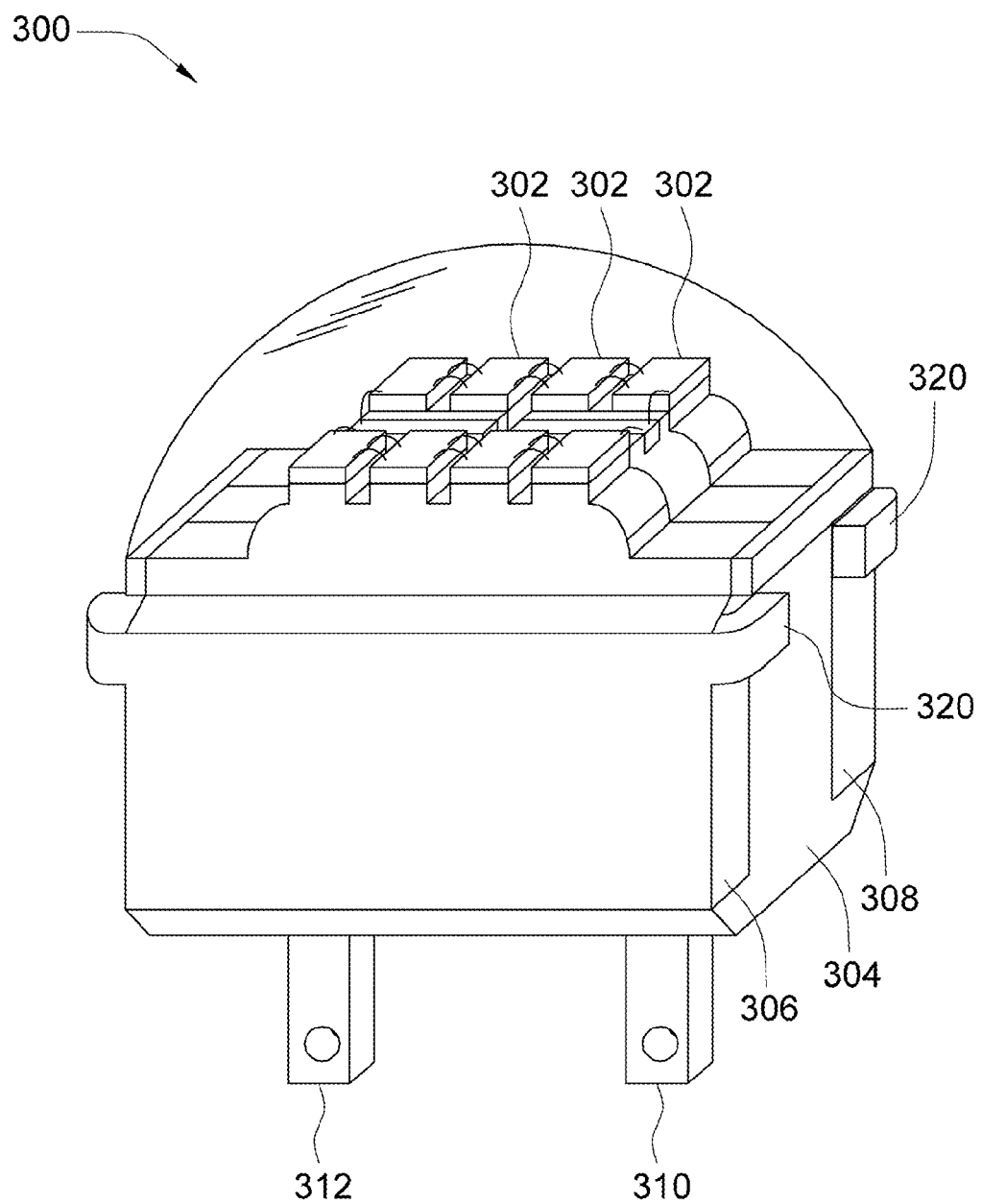

The dissipating leadframes 306 and 308 and the main leadframe 304 can be combined by soldering or through other elements. Referring to FIGS. 9C and 9D, diagrams of a stacked light emitting device being fixed with a frame are shown. After the dissipating leadframes 306 and 308 are assembled to the main leadframe 304, the frame 318 is disposed on the above assembled device. The frame is made from a metal similar to the dissipating leadframes 306 and 308. Referring to FIGS. 9E and 9F, diagrams of a stacked light emitting device being fixed with extension pieces are shown. As shown in FIG. 9E, two extension pieces 320 are disposed on the dissipating leadframes 306 and 308 for bending the extension piece 320 towards the main leadframe 304. The extension pieces 320 clamp two opposite sides of the main leadframe 304 as shown in FIG. 9F, such that the dissipating leadframes 306 and 308 are fixed on the main leadframe 304.

Figure 9G:
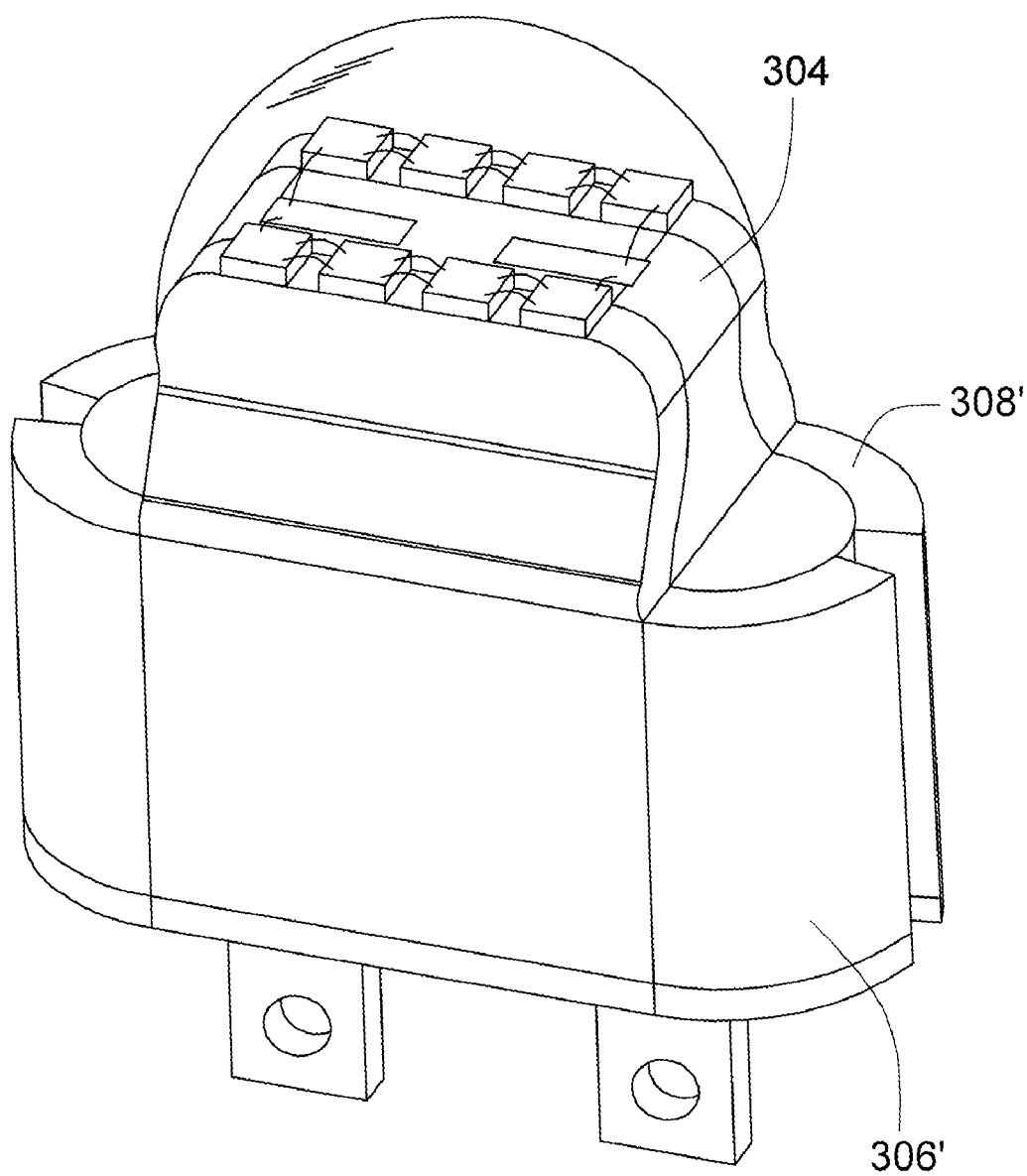
FIGS. 9G and 9H show other variations of the stacked light emitting device.
Figure 9H:
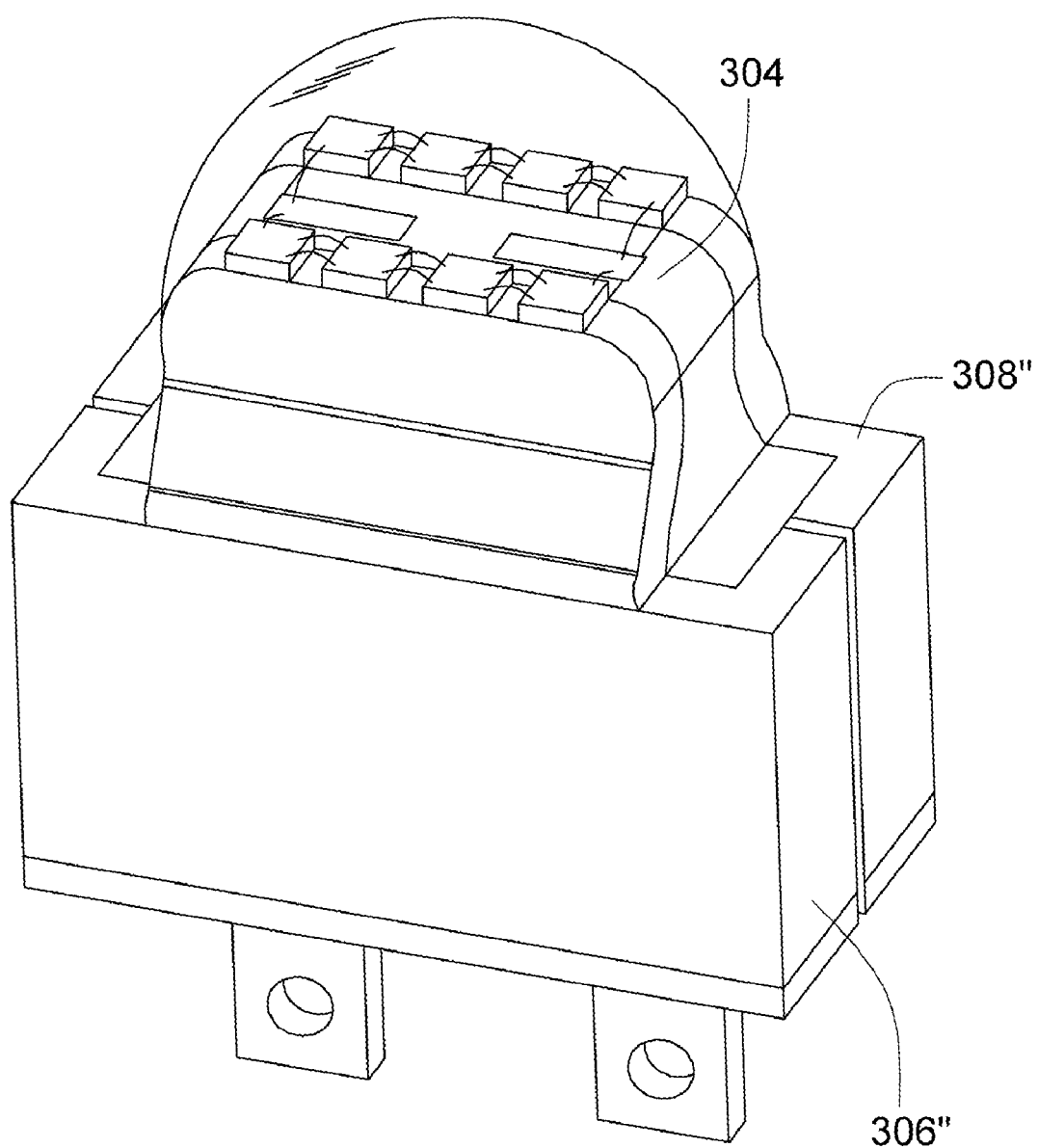

Referring to FIGS. 9G and 9H, other variations of the stacked light emitting device are shown. As shown in FIG. 9G, the part extended from the edge of the dissipating leadframes 306' and 308' is an arc-shaped structure which covers the entire edge of the main leadframe 304. As shown in FIG. 9H, the edges of the dissipating leadframes 306'' and 308'' are bent such that the edges of the dissipating leadframes 306'' and 308'' each have a bending angle.

The light emitting unit 302 of the present embodiment of the disclosure is exemplified by an LED chip, which is electrically connected to the electrode pins 310 and 312 by way of wire bonding. The wire bonding platform can have 4 or 8 pins by stacking two layers together. Also, the wire bonding point can be disposed at two sides of the light emitting unit 302 or at the side facing outward. Fluorescent powders can be applied on the surface of the LED chip to generate the mixing lights of different colors.

Figure 10:
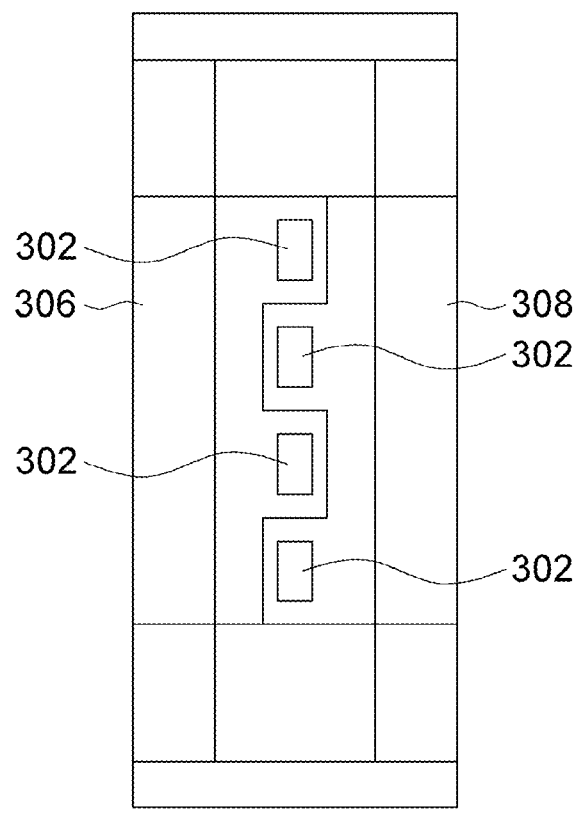
FIG. 10 shows light emitting units being arranged alternately.

Although the light emitting units 302 are disposed on the dissipating leadframes 306 and 308 in a one-to-one manner, the disclosure is not limited thereto. Referring to FIG. 10, a plurality of light emitting units being disposed alternately is shown. The light emitting units 302 on the dissipating leadframe 306 and the light emitting units 302 on the dissipating leadframe 308 are alternately disposed and arranged in one row, hence reducing the overall thickness of the stacked light emitting device 300.

Figure 11A:
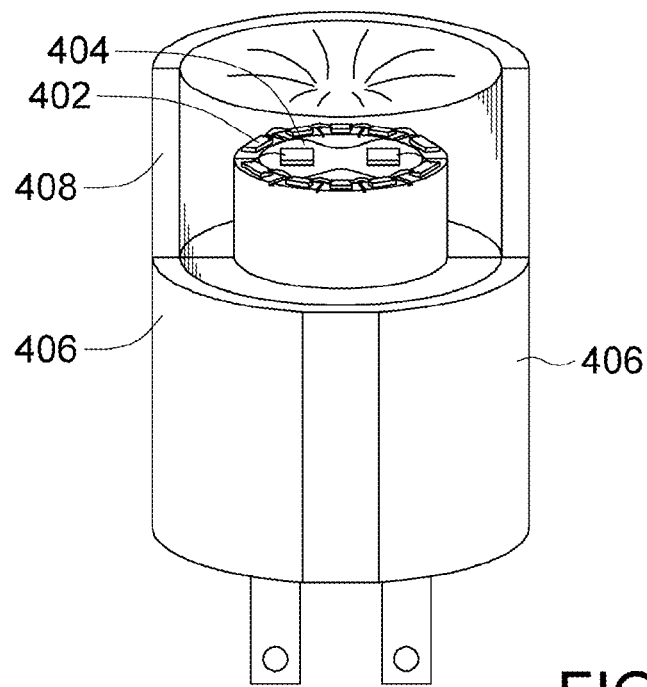
FIG. 11A shows a stacked light emitting device being a pillar-shaped structure.
Figure 11B:
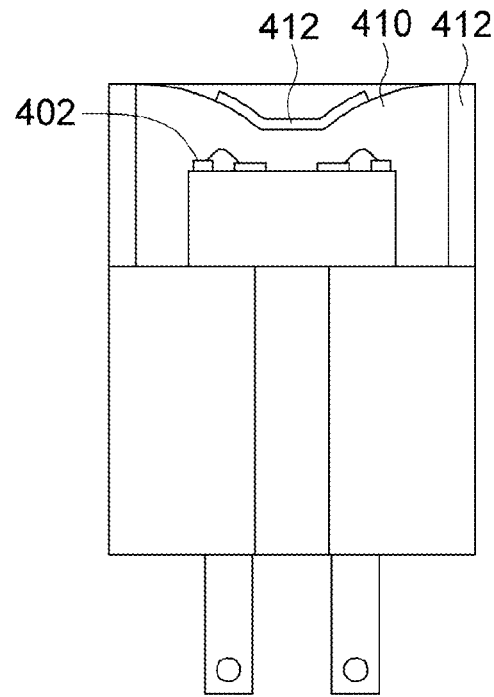
FIG. 11B shows a side view of a stacked light emitting device of FIG. 11A.
Figure 12A:
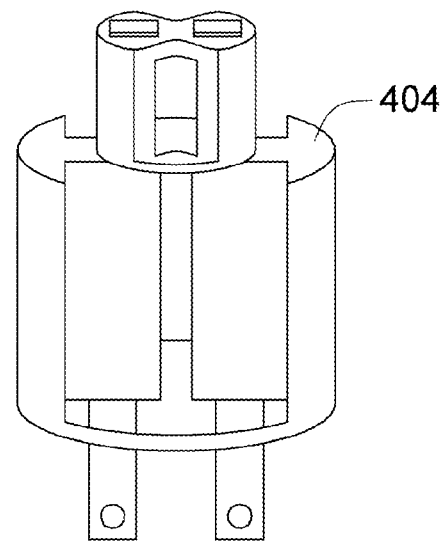
FIG. 12A shows a main leadframe of FIG. 11A.
Figure 12B:
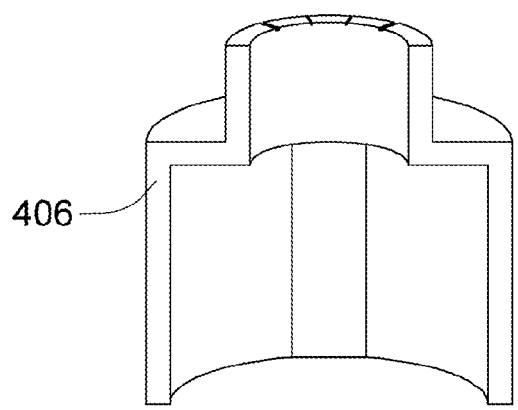
FIG. 12B shows a dissipating leadframe of FIG. 11A.

FIG. 11A shows a stacked light emitting device being a pillar-shaped structure. FIG. 11B shows a side view of a stacked light emitting device of FIG. 11A. FIG. 12A shows a main leadframe of FIG. 11A. FIG. 12B shows a dissipating leadframe of FIG. 11A. The two dissipating leadframes 406 and 408 of the stacked light emitting device 400 are arc-shaped pieces (as shown in FIG. 12B) which clamp the main leadframe 404 by the two opposite sides of the main leadframe 404 (as illustrated in FIG. 12A). The light emitting units 402 are circularly disposed on the top surface of the dissipating leadframes 406 and 408. Each light emitting units 402 has a transparent encapsulant 410 disposed thereon, and a fluorescent colloid layer 412 can be disposed outside the transparent encapsulant 410.

According to the stacked light emitting device of the present embodiment of the disclosure, the main leadframe and the dissipating leadframes are stacked, and the dissipating leadframes are disposed at two sides of the main leadframe, such that electrical conduction is carried out inside the structure and the path of thermal conduction is outside the structure. The stacked light emitting device of the present embodiment of the disclosure is able to isolate the electrical conduction from thermal conduction. As the electrode pins are extended outward from the bottom surface of the main leadframe, the stacked light emitting device is in ready-to-plug state. Thus, the stacked light emitting device, which can be easily plugged and unplugged, can be easily assembled with other elements.

As for the light emitting device with higher voltage, the accompanied dissipating leadframes must have better heat dissipating capacity and are normally implemented as thicker structures. Each elements of the stacked light emitting device of the present embodiment of the disclosure can be respectively processed first and assembled next, hence having more flexibility in the adjustment of the size to fulfill the precision requirement in volume production. Also, the interference with other package elements in the manufacturing process is reduced. Thus, the stacked light emitting device of the present embodiment of the disclosure can further be used in related field of lighting technologies or the light emitting device with high output watt output.

While the disclosure has been described by way of example and in terms of a preferred embodiment, it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A light emitting device, comprising:
    a leadframe;
    a light emitting unit disposed on the leadframe;
    a non-transparent side element surrounding the light emitting unit;
    a transparent encapsulant covering the light emitting unit and located inside the non-transparent side element, wherein an upper surface of the transparent encapsulant has a concave on which a reflective surface is disposed; and
    a fluorescent colloid layer disposed at the side wall of the transparent encapsulant and located between the non-transparent side element and the transparent encapsulant;
    wherein the light generated by the light emitting unit is reflected by the reflective surface and guided to the side wall of the transparent encapsulant to excite the fluorescent colloid layer and generate a mixed light, the mixed light is then guided to the top of the transparent encapsulant by the non-transparent side element.

2. The light emitting device according to claim 1, wherein the leadframe has two conductive branches electrically connected with the light emitting unit.

3. The light emitting device according to claim 1, further comprising a front light-collecting lens disposed at the top of the transparent encapsulant for controlling light-emitting direction.

4. The light emitting device according to claim 3, wherein the front light-collecting lens is a convex lens.

5. The light emitting device according to claim 3, wherein the cross section of the front light-collecting lens has a plurality of interconnected quarter circles.

6. A light emitting device, comprising:
    a leadframe;
    a non-transparent carrier disposed under the leadframe;
    a light emitting unit disposed on the leadframe;
    a transparent encapsulant covering the light emitting unit and disposed on the non-transparent carrier, wherein an upper surface of the transparent encapsulant has a plurality of reflective surfaces; and
    a plurality of fluorescent colloid layers disposed at a plurality of side walls of the transparent encapsulant and adjacent to the reflective surfaces;
    wherein when the light of the light emitting unit is guided to the fluorescent colloid layers by the reflective surfaces of the transparent encapsulant, the light then excites the fluorescent colloid layers.

7. The light emitting device according to claim 6, wherein the fluorescent colloid layer are vertically disposed on the transparent encapsulant.

8. The light emitting device according to claim 6, further comprising a plurality of non-transparent reflective layers disposed on the reflective surfaces.

9. The light emitting device according to claim 6, wherein the fluorescent colloid layers are embedded into the transparent encapsulant.

10. The light emitting device according to claim 6, wherein the leadframe has a reflective cup in which the light emitting unit is disposed.

11. A light emitting device, comprising:
    a leadframe;
    a light emitting unit disposed on the leadframe;
    a transparent encapsulant covering the light emitting unit and having a reflective surface;
    a fluorescent colloid layer disposed on the reflective surface of the transparent encapsulant;
    a non-transparent reflective layer covering the fluorescent colloid layer; and
    a non-transparent carrier disposed at the bottom side of the leadframe;
    wherein the light generated by the light emitting unit is guided to the fluorescent colloid layer by the non-transparent reflective layer for exciting the fluorescent colloid layer, and the light from the fluorescent colloid layer and the light emitting unit is controlled to be outputted from a region restricted by the non-transparent carrier and the non-transparent reflective layer.

12. The light emitting device according to claim 11, wherein the leadframe has a reflective cup in which the light emitting unit is disposed.

13. The light emitting device according to claim 11, wherein the reflective surface has a plurality of segments, the fluorescent colloid layer is disposed on parts of the segments.

14. The light emitting device according to claim 11, further comprising another fluorescent colloid layer disposed between the transparent encapsulant and the non-transparent reflective layer, and at least one transparent spacer layer disposed between the fluorescent colloid layers.

15. The light emitting device according to claim 11, wherein the reflective surface has a curvature.

16. The light emitting device according to claim 11, wherein the non-transparent reflective layer is extended outward from a top edge of the transparent encapsulant.

17. The light emitting device according to claim 11, further comprising a reflector disposed outside the light emitting unit.

18. The light emitting device according to claim 11, wherein the transparent encapsulant has a concave on which the reflective surface is located, the light emitting device further comprises another light emitting unit, the light emitting units are disposed on the leadframe and symmetrically disposed at two sides of a lowest point of the concave.

* * * * *